United States Patent
Pal et al.

(10) Patent No.: US 12,266,746 B2
(45) Date of Patent: Apr. 1, 2025

(54) PHOSPHOR-CONVERTED LIGHT-EMITTING DIODE WITH DIELECTRIC SPACER

(71) Applicant: LUMILEDS LLC, San Jose, CA (US)

(72) Inventors: Debapriya Pal, Amsterdam (NL); Albert Femius Koenderink, Amsterdam (NL); Antonio Lopez-Julia, Aachen (DE); Mohamed S. Abdelkhalik, Eindhoven (NL); Jaime Gomez Rivas, Eindhoven (NL); Aleksandr Vaskin, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 18/667,045

(22) Filed: May 17, 2024

(65) Prior Publication Data

US 2024/0313178 A1    Sep. 19, 2024

Related U.S. Application Data

(63) Continuation of application No. PCT/US2022/050084, filed on Nov. 16, 2022.
(Continued)

(51) Int. Cl.
*H01L 33/60* (2010.01)
*H01L 27/15* (2006.01)
(Continued)

(52) U.S. Cl.
CPC ............ *H01L 33/60* (2013.01); *H01L 33/507* (2013.01); *H01L 27/156* (2013.01)

(58) Field of Classification Search
CPC ...... H01L 33/502; H01L 33/46; H01L 33/507
See application file for complete search history.

(56) References Cited

U.S. PATENT DOCUMENTS

| | | |
|---|---|---|
| 2017/0023188 A1 | 1/2017 | Mima et al. |
| 2018/0316160 A1 | 11/2018 | Raring et al. |

(Continued)

FOREIGN PATENT DOCUMENTS

EP    3598184 A1    1/2020

OTHER PUBLICATIONS

From the EPO as the International Searching Authority, "Notification of Transmittal of the International Search Report and the Written Opinion of the International Searching Authority, or the Declaration", PCT/US2022/050084, Mar. 20, 2023, 11 pages.

*Primary Examiner* — Antonio B Crite

(57) ABSTRACT

A light-emitting device includes: a semiconductor diode structure, a reflector, a wavelength-converting layer, and an intermediate spacer between the diode structure and the wavelength-converting layer. The diode structure emits diode output light at a vacuum wavelength $\lambda_0$ to propagate within the diode structure. The reflector is on the back diode structure and internally reflects diode internally incident output light. The wavelength-converting layer is positioned with its back surface facing and spaced-apart from a front surface of the diode structure, and absorbs diode output light at $\lambda_0$ and emits down-converted light at a vacuum wavelength $\lambda_1 > \lambda_0$, which exits the wavelength-converting layer through its front surface. The intermediate spacer includes one or more transparent dielectric layers and has an effective refractive index less than that of the wavelength-converting layer, so that the wavelength-converting layer acts as an optical waveguide supporting one or more laterally propagating optical modes at $\lambda_0$ and $\lambda_1$.

20 Claims, 13 Drawing Sheets

Related U.S. Application Data

(60) Provisional application No. 63/289,869, filed on Dec. 15, 2021.

(51) Int. Cl.
*H01L 33/22* (2010.01)
*H01L 33/42* (2010.01)
*H01L 33/46* (2010.01)
*H01L 33/50* (2010.01)

(56) References Cited

U.S. PATENT DOCUMENTS

| | | | |
|---|---|---|---|
| 2019/0123033 A1* | 4/2019 | Martin | H01L 24/16 |
| 2019/0198727 A1 | 6/2019 | Shen et al. | |
| 2020/0025341 A1* | 1/2020 | Murai | F21K 9/64 |
| 2020/0117030 A1* | 4/2020 | Lee | G02B 6/005 |
| 2020/0203585 A1* | 6/2020 | Lopez-Julia | H01L 33/507 |
| 2020/0395403 A1* | 12/2020 | Ahmed | G09F 9/33 |
| 2022/0246673 A1* | 8/2022 | Suh | H01L 27/156 |
| 2022/0352437 A1* | 11/2022 | Song | H01L 33/507 |
| 2023/0148430 A1* | 5/2023 | Kim | H01L 27/156 |
| | | | 257/89 |

* cited by examiner

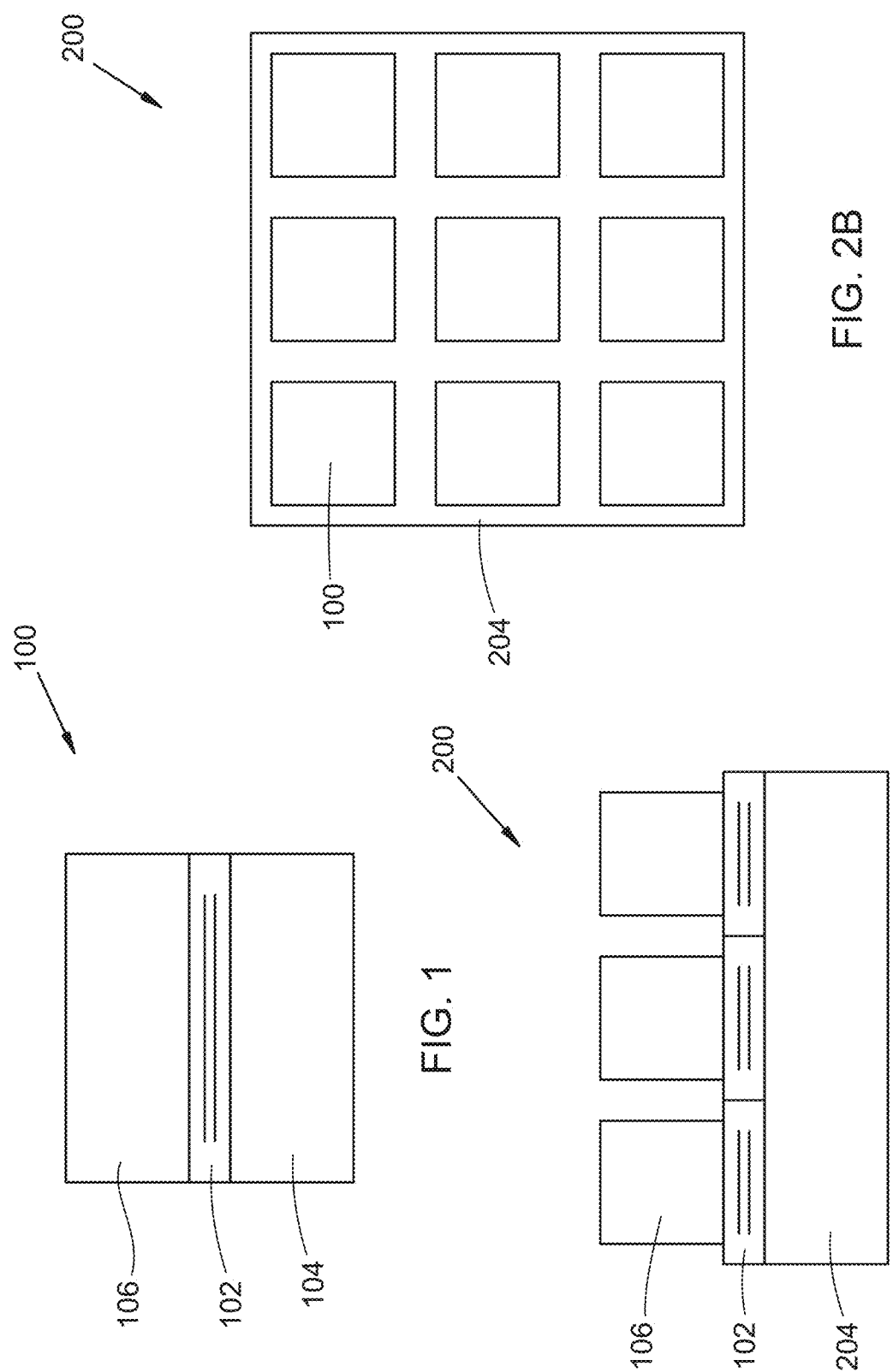

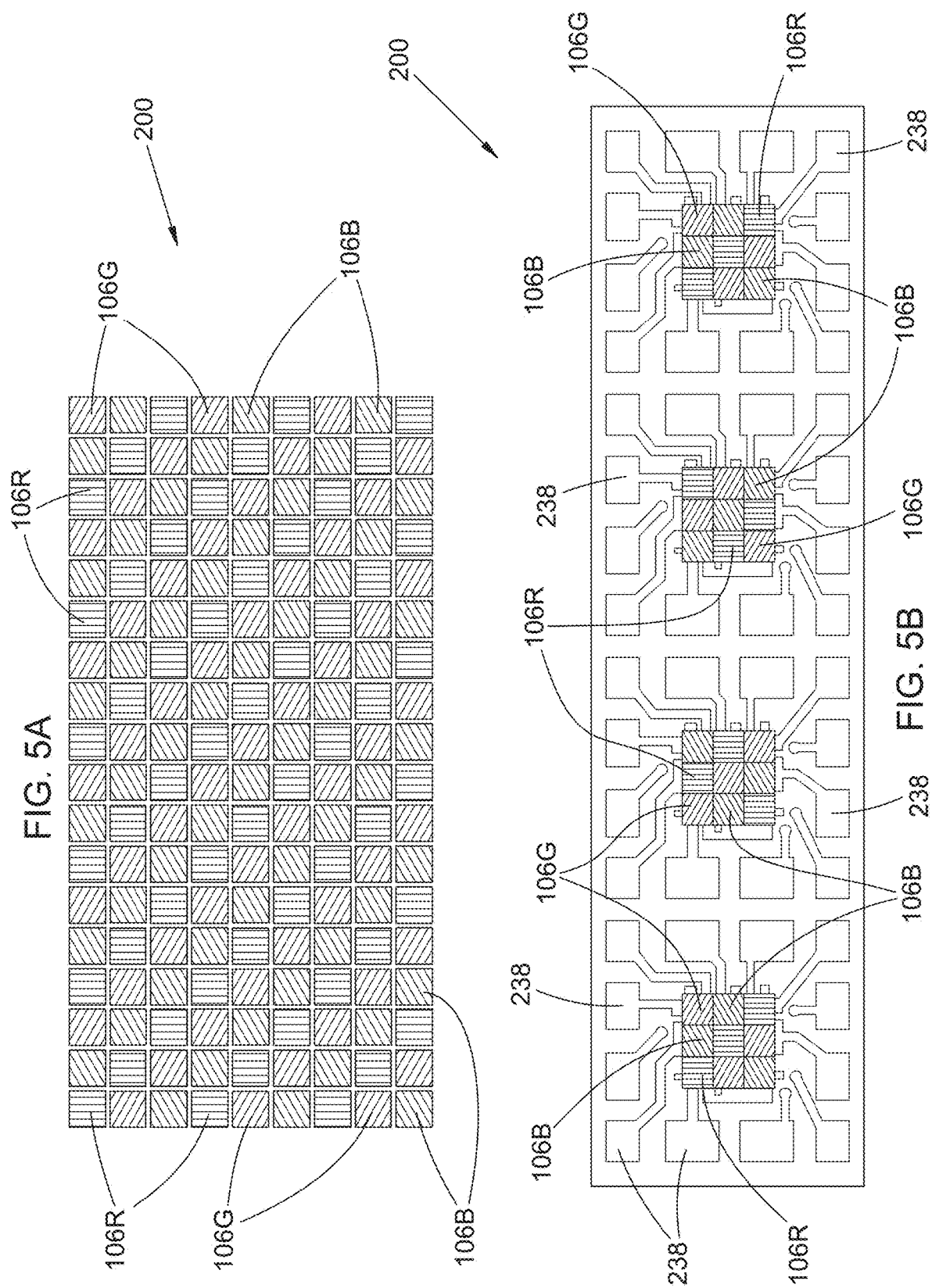

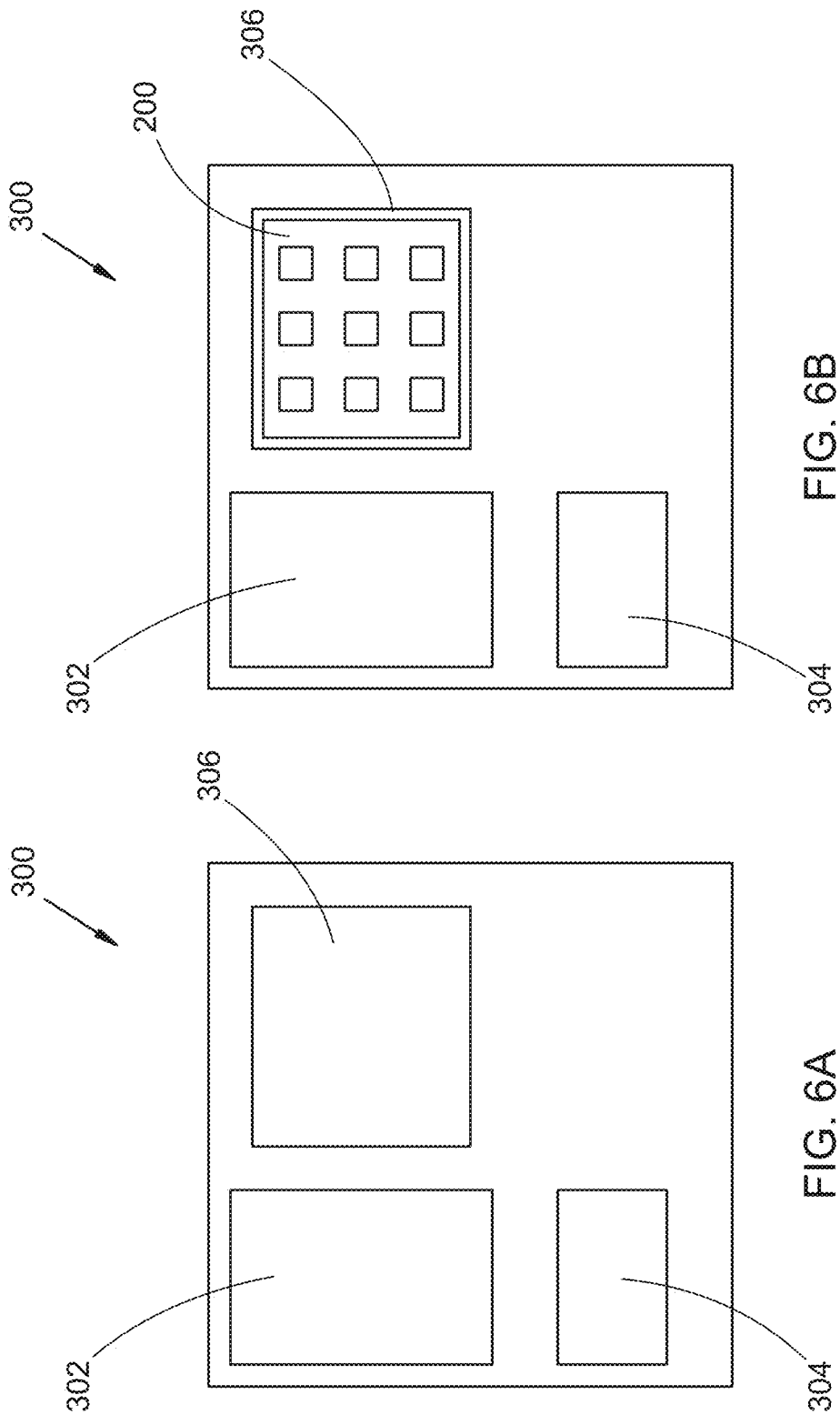

PHOSPHOR-CONVERTED LIGHT-EMITTING DIODE WITH DIELECTRIC SPACER

This application is a continuation of App. No. PCT/US2022/050084 entitled "Phosphor-converted light-emitting diode with dielectric spacer" filed 16 Nov. 2022 in the names of Pal et al, which in turn claims priority of U.S. provisional App. No. 63/289,869 entitled "Phosphor-converted light-emitting diode with dielectric spacer" filed 15 Dec. 2021 in the names of Pal et al, both of said applications being hereby incorporated by reference as if fully set forth herein.

FIELD OF THE INVENTION

The invention relates generally to light-emitting diodes and to phosphor-converted light-emitting diodes.

BACKGROUND

Semiconductor light-emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength-converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lights, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a pLED array). Such mini- or microLED arrays can in many instances also include phosphor converters as described above; such arrays can be referred to as pc-miniLED or pc-microLED arrays.

SUMMARY

An inventive semiconductor light-emitting device comprises: a semiconductor diode structure, a reflector, a wavelength-converting layer, and an intermediate spacer. The semiconductor diode structure includes first and second doped semiconductor layers and an active layer between them. The active layer emits diode output light, resulting from electrical current flow through the diode structure, at a nominal emission vacuum wavelength $\lambda_0$ to propagate within the diode structure. The reflector is positioned against a back surface of the second semiconductor layer and internally reflects diode output light incident from within the diode structure. The wavelength-converting layer is positioned with its back surface facing and spaced-apart from a front surface of the first semiconductor layer. The wavelength-converting layer absorbs diode output light at the vacuum wavelength $\lambda_0$ and in response emits down-converted light at a vacuum wavelength $\lambda_1$ that is greater than $\lambda_0$. At least a portion of the down-converted light exits the wavelength-converting layer through its front surface.

The intermediate spacer is positioned between the first semiconductor layer and the wavelength-converting layer and comprises one or more dielectric layers. Each dielectric layer of the spacer is at least partly transparent at the vacuum wavelength $\lambda_0$, and the intermediate spacer has an effective refractive index $n_S$ less than an effective refractive index $n_C$ of the wavelength-converting layer. The wavelength-converting layer thereby acts as an optical waveguide supporting one or more laterally propagating optical modes at the vacuum wavelengths $\lambda_0$ and $\lambda_1$.

An inventive semiconductor light-emitting device can further include one or more of: a front array of micro- or nano-structured scattering elements at the front surface of the wavelength-converting layer, an output optical structure positioned on a front surface of the wavelength-converting layer, or a back array of micro- or nano-structured scattering elements at the back surface of the wavelength-converting layer.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

Figure 3A:
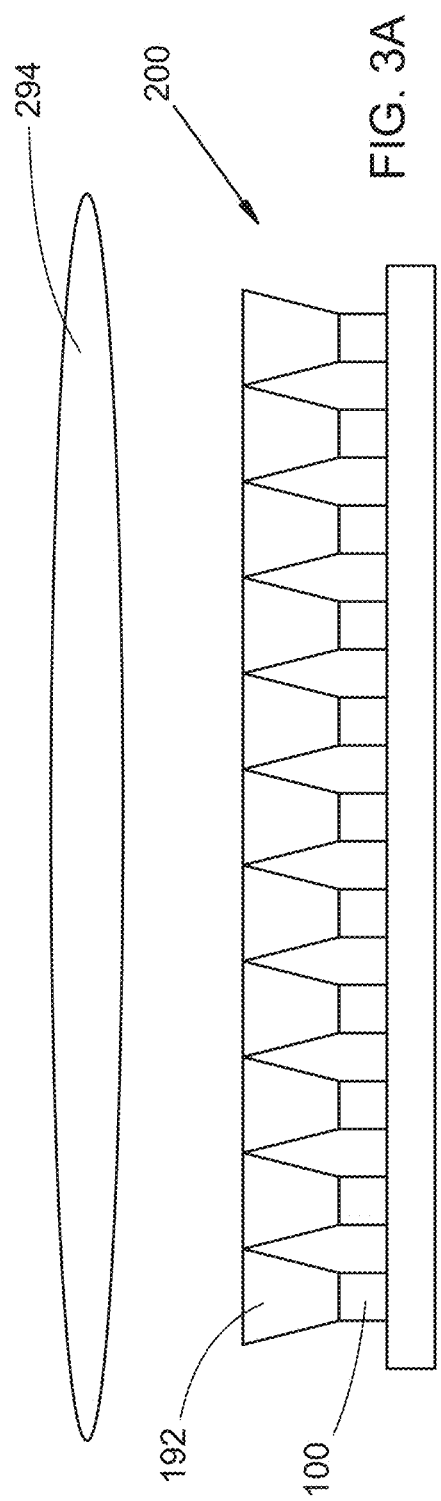
FIG. 3A shows a schematic cross-sectional view of an example array of pcLEDs arranged with respect to waveguides and a projection lens.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail. For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them.

Conversely, any arrangement of a layer, surface, substrate, diode structure, or other structure "directly on," "directly over," or "directly against" another such structure shall encompass only arrangements with direct contact between the two structures.

FIG. 1 shows an example of an individual pcLED 100 comprising a semiconductor diode structure 102 disposed on a substrate 104, together considered herein an "LED" or "semiconductor LED", and a wavelength-converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength-converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array can include any suitable number of pcLEDs arranged in any suitable manner. In the illustrated example the array is depicted as formed monolithically on a shared substrate, but alternatively an array of pcLEDs can be formed from separate individual pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Figure 3B:
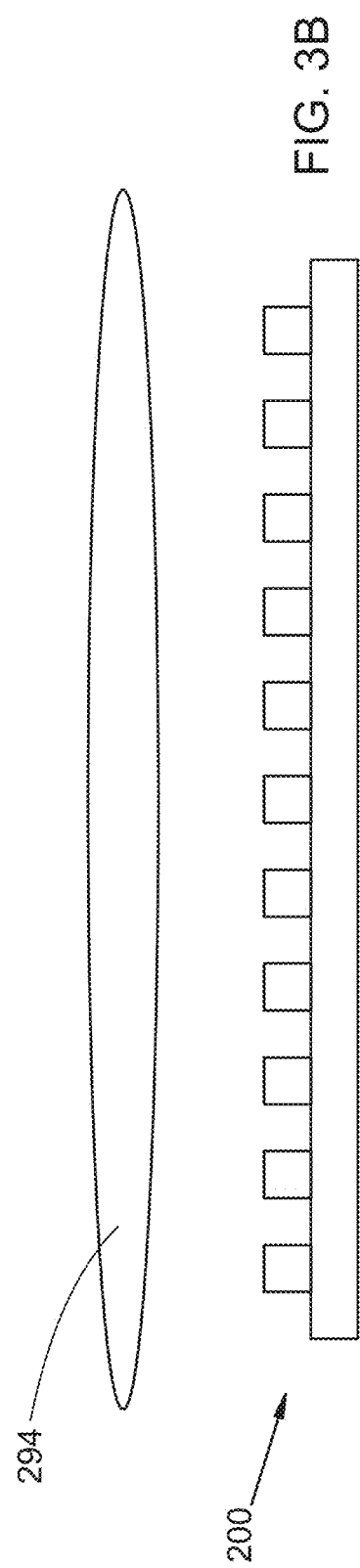
FIG. 3B shows an arrangement similar to that of FIG. 3A, but without the waveguides.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Figure 4A:
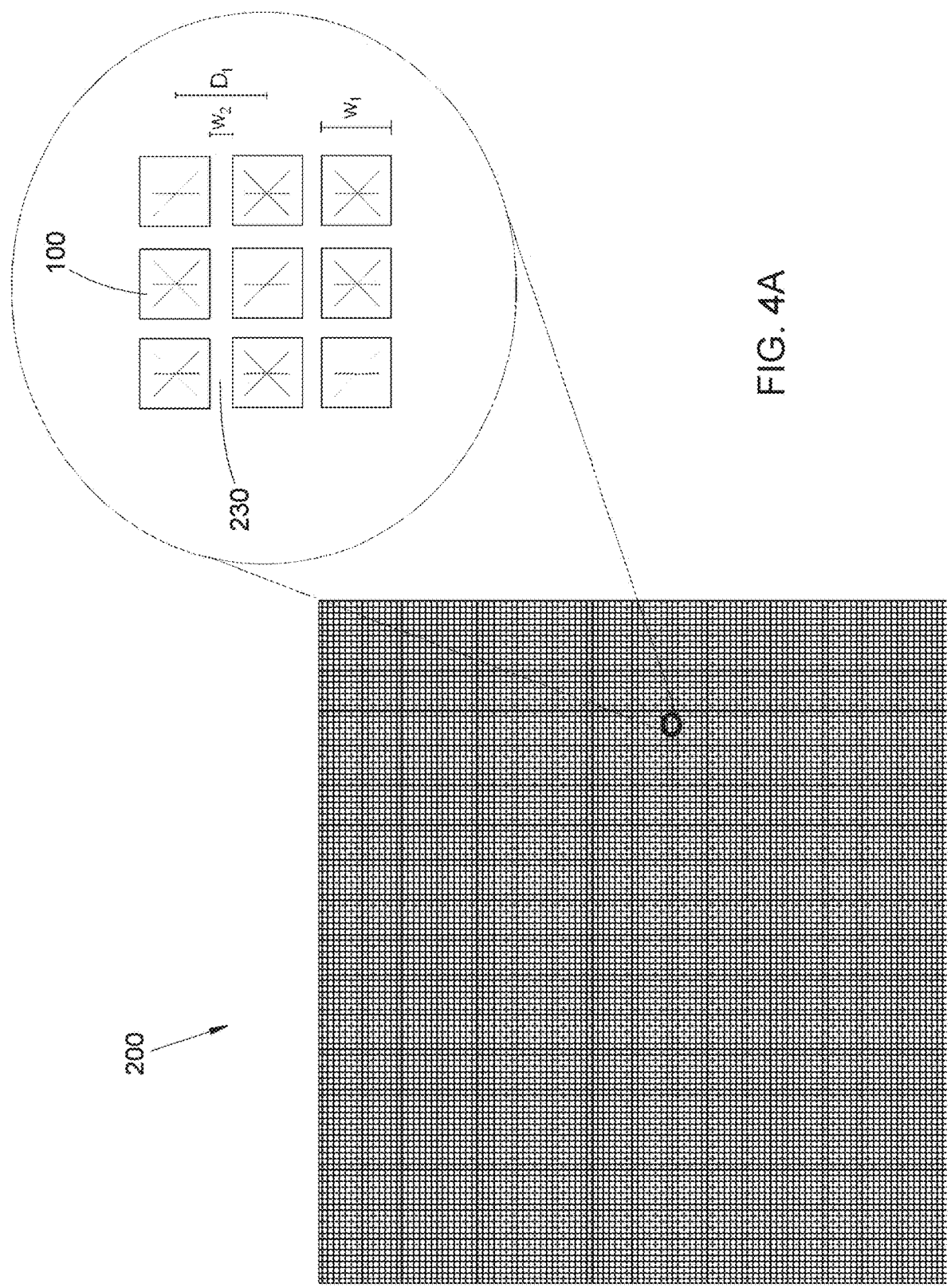
FIG. 4A shows a top schematic view of an example miniLED or microLED array and an enlarged section of 3×3 LEDs of the array.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be separated from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
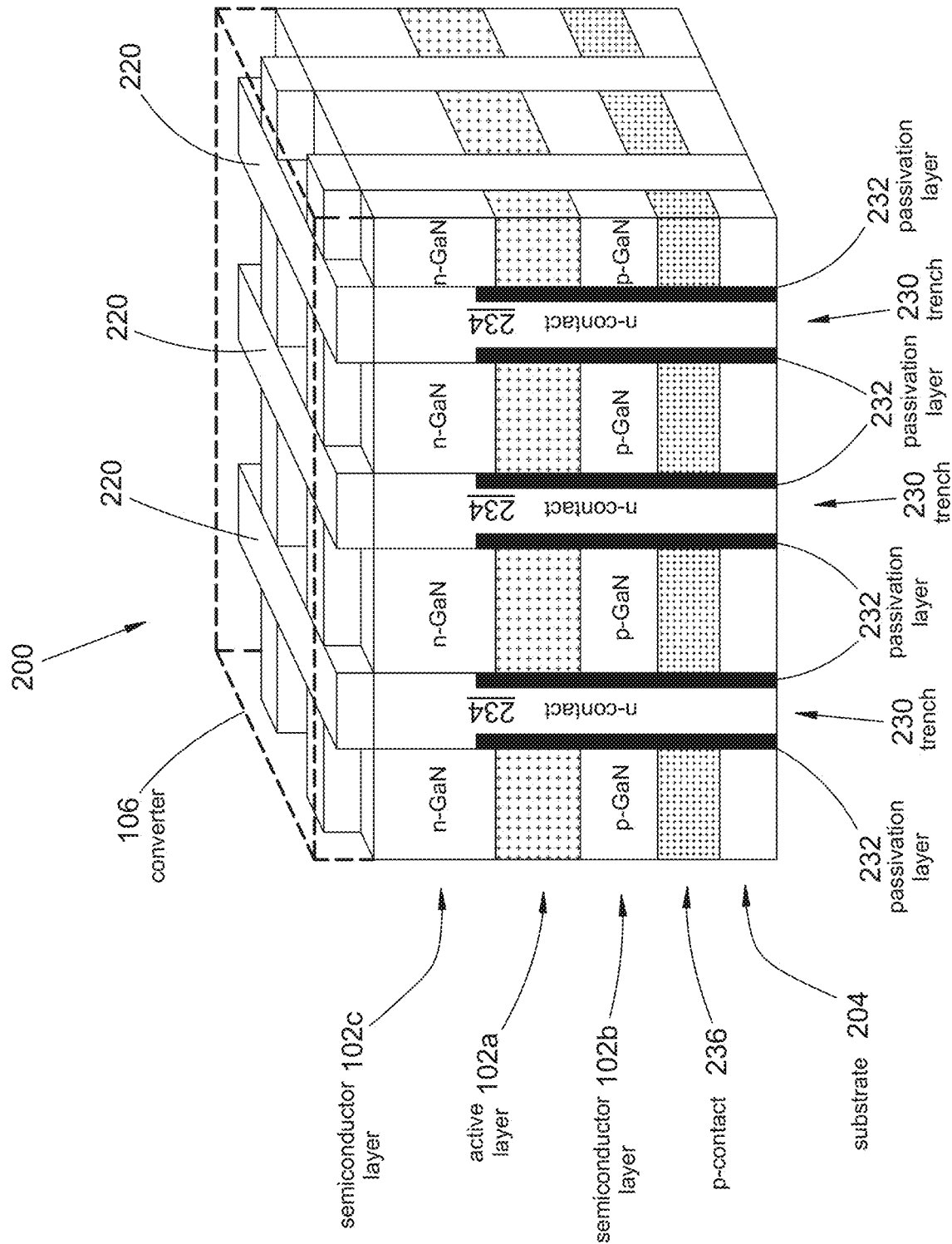
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
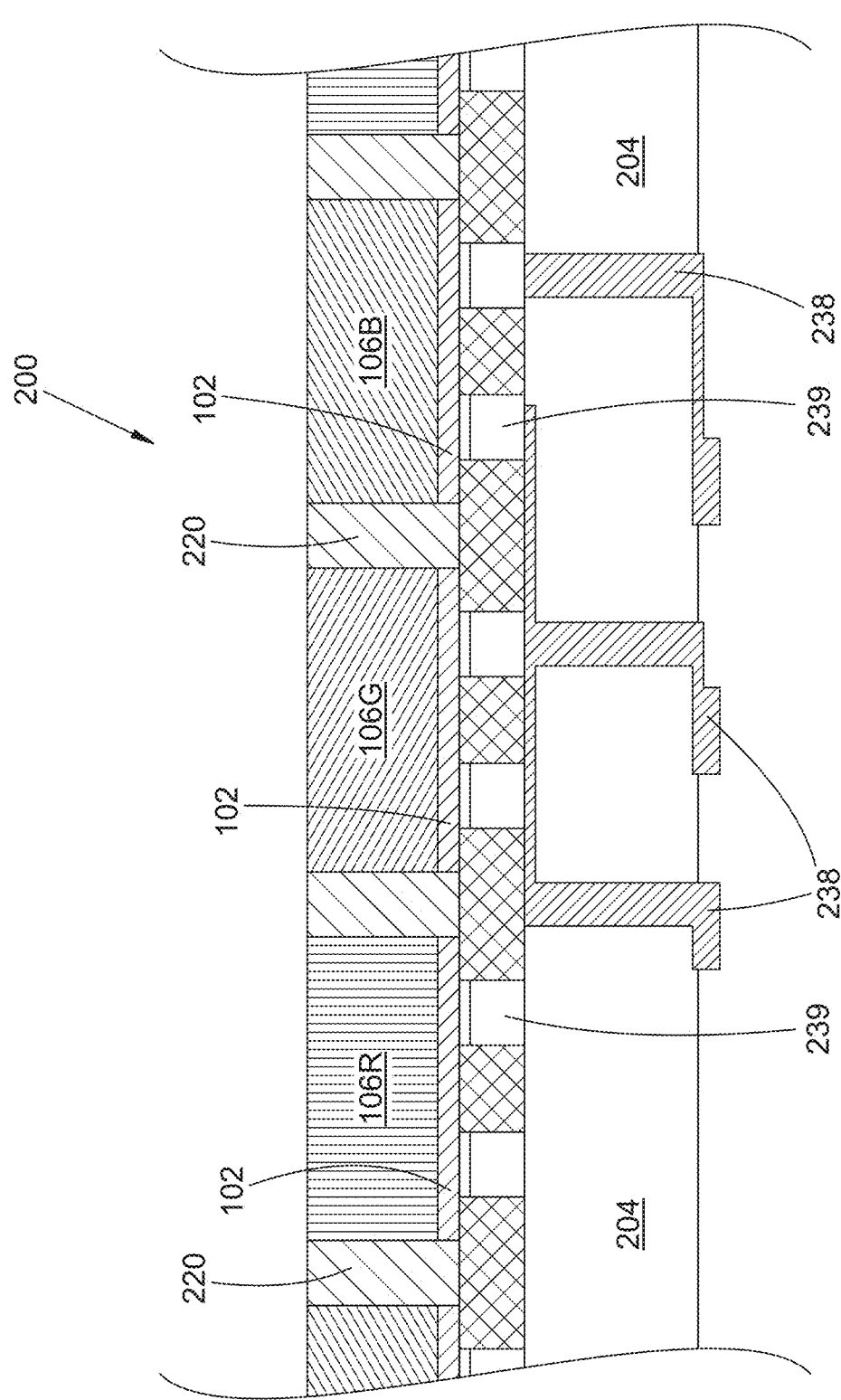
FIG. 4C is a side cross-sectional schematic diagram of an example of a close-packed array of multi-colored phosphor-converted LEDS on a monolithic die and substrate.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light-emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light-emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

Inventive examples of individual light-emitting devices 100 (i.e., individual pcLEDs 100) are illustrated schematically in FIGS. 7 through 12B. Such inventive light-emitting devices 100 can be used individually or as part of an array 200. An inventive light-emitting device 100 comprises a semiconductor diode structure 102, a reflector 600, an intermediate spacer 700, and a wavelength-converting layer 106. The diode structure 102, the reflector 600, the intermediate spacer 700, and wavelength-converting layer 106 are arranged so that (i) at least a portion of the diode output light exits the diode structure 102 through its front surface, propagates through the intermediate spacer 700, enters the wavelength-converting layer 106 through its back surface, and is absorbed by the wavelength-converting layer 106, and (ii) at least a portion of the down-converted light emitted by the wavelength-converting layer 106 in response to absorption of diode output light exits the wavelength-converting layer 106 through its front surface. "Forward" and "backward" directions are generally perpendicular to the layers of the diode structure 102 and wavelength-converting layer 106; "lateral" directions are generally parallel to those layers. Designations of directions or surface as, e.g., "front" or "forward" versus "back", "backward", "rear", or "rearward" are arbitrary but employed consistently only for convenience of description.

The semiconductor diode structure 102 can be of any suitable type or arrangement (e.g., a light-emitting diode or LED) formed using any one or more suitable fabrication techniques, and includes first and second doped semiconductor layers 102b/102c and an active layer 102a between them. With electrical current flowing through the diode structure 102, the active layer 102a emits diode output light at a nominal emission vacuum wavelength $\lambda_0$ to propagate within the diode structure 102. In some examples the diode structure 102 can include one or more doped or undoped III-V, II-VI, or Group IV semiconductor materials or alloys or mixtures thereof. The active layer 102a can be arranged in any suitable way for emitting diode output light, and can include, e.g., one or more p-n junctions, one or more quantum wells, one or more multi-quantum wells, or one or more quantum dots. In some examples the vacuum wavelength $\lambda_0$ can be (i) greater than about 0.20 µm, greater than about 0.4 µm, or greater than about 0.8 µm, or (ii) less than about 10 µm, less than about 2.5 µm, or less than about 1.0 µm. In many common examples the vacuum wavelength $\lambda_0$ is in the blue region of the visible spectrum (e.g., about 440-450 nm), and the vacuum wavelength $\lambda_1$ is in the green or red portion of the visible spectrum.

The reflector 600 is positioned against a back surface of the second semiconductor layer 102b and can be formed using any one or more suitable fabrication techniques. The reflector 600 is arranged to internally reflect diode output light propagating within the diode structure 102 that is incident on the reflector 600. The reflector can be of any suitable type of arrangement. In some examples the reflector 600 can be a metal reflector layer on a back surface of the second semiconductor layer 102b; such a metal reflector layer can include one or more of aluminum, silver, gold, or other suitable metal or metal alloy. In some of those examples the metal reflector layer can also act as an electrode for conveying electric current to or from the diode structure 102.

In some examples the reflector 600 can include one or more layers of one or more dielectric materials that are transparent at the vacuum wavelength $\lambda_0$. The one or more dielectric layers have an effective refractive index less than that of the second semiconductor layer 102b. For purposes of the present disclosure and appended claims, "transparent" shall denote a material, layer, or structure that transmits a fraction of incident light at a designated wavelength that is large enough so that the device incorporating that material, layer, or structure functions as needed or desired, i.e., within operationally acceptable parameters (e.g., output power or luminance, angular output distribution, conversion or extraction efficiency, or other figures-of-merit including any described herein). In many instances the fraction transmitted might be relatively large (e.g., greater than 80%, 90%, or 95%); in other instances the fraction transmitted needed for device functionality might be lower than that. The effective refractive index of a set of multiple dielectric layers (e.g., an average refractive index of multiple layers) can be less than that of the semiconductor layer 102b even though some individual layers might have a refractive index higher than that.

In some examples the reflector 600 can include multiple transparent dielectric layers arranged as a multi-layer-reflector (MLR) structure, e.g., as a distributed Bragg reflector (DBR). In some examples the reflector 600 can include a reflector array of micro- or nano-structured scattering elements arranged as one or more of a MLR structure, a micro- or nano-structured diffractive MLR structure, a distributed Bragg reflector (DBR), a quasi-guided-mode (QGM) structure, or a surface-lattice-resonance (SLR) structure. In some examples the reflector 600 can be positioned in near-field proximity to the active layer 102a. In some examples the reflector 600 can include a reflector array of micro- or nano-structured scattering elements arranged so that the reflector 600 exhibits non-specular reflective redirection of diode output light incident thereon from within the diode structure (e.g., in some examples arranged in a manner similar to the arrangements illustrated schematically in FIGS. 13A-13E). Various of those arrangements are disclosed in, e.g., U.S. Pat. Pub. No. 2021/0184081 published 17 Jun. 2021, U.S. provisional App. No. 63/232,960 filed 13 Aug. 2021, U.S. provisional App. No. 63/232,965 filed 13 Aug. 2021, or U.S. provisional App. No. 63/233,043 filed 13 Aug. 2021, each of which is incorporated herein by reference in its entirety. In some examples the one or more dielectric layers of the reflector 600 can include one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

In some examples the reflector 600 can include a metal reflector layer (including, e.g., one or more of aluminum, silver, gold, or other suitable metal or metal alloy) on its back surface, with the one or more dielectric layers (e.g., such as the arrangements described above) between the metal reflector layer and the semiconductor layer 102b. In some examples, only a single dielectric layer is positioned between the metal reflector layer and the semiconductor layer 102b.

Some examples, in which the reflector 600 includes one or more dielectric layers, can also include a transparent electrode layer arranged for conveying electric current to or from the diode structure 102. Such an electrode layer is often positioned against the semiconductor layer 102b. In some examples the transparent electrode layer can include one or more of indium tin oxide, indium zinc oxide, or one or more other transparent conductive oxides.

Some examples, in which the reflector 600 includes one or more dielectric layers, can also include one or more electrically conductive vias. Each via can be arranged as a localized, circumscribed electrical conduction path through the one or more layers of dielectric material of the reflector 600. The vias can connect directly to the second semiconductor layer 102b, to a transparent electrode layer (if present), or to a metal reflector layer (if present).

The wavelength-converting layer 106 is positioned with its back surface facing and spaced-apart from the front surface of the first semiconductor layer 102c, and can be formed using any one or more suitable fabrication techniques. The wavelength-converting layer 106 absorbs diode output light at the vacuum wavelength $\lambda_0$ and in response emits down-converted light at a vacuum wavelength $\lambda_1$, with $\lambda_1 > \lambda_0$. At least a portion of the down-converted light exits the wavelength-converting layer 106 through its front surface.

The intermediate spacer 700 is positioned between the front surface of the first semiconductor layer 102c and the back surface of the wavelength-converting layer 106, and can be formed using any suitable one or more fabrication techniques. In some examples the intermediate spacer 700 can be positioned directly against one or both of the front surface of the first semiconductor layer 102c and the back surface of the wavelength-converting layer 106. The intermediate spacer 700 comprises one or more dielectric layers, each at least partly transparent at the vacuum wavelengths $\lambda_0$ and $\lambda_1$. The intermediate spacer 700 has an effective refractive index $n_S$ less than an effective refractive index $n_C$ of the wavelength-converting layer 106. The wavelength-converting layer 106 therefore acts as an optical waveguide supporting one or more laterally propagating optical modes at the vacuum wavelengths $\lambda_0$ and $\lambda_1$.

In some examples the wavelength-converting layer 106 can exhibit an effective refractive index greater than about 1.7, greater than about 1.8, greater than about 1.9, greater than about 2.0, greater than about 2.2, or greater than about 2.4. In some examples the intermediate spacer 700 can exhibit an effective refractive index less than about 1.7, less than about 1.6, less than about 1.5, or less than about 1.4. In some examples the magnitude of the difference of effective refractive indices between the wavelength-converting layer 106 and the intermediate spacer 700 can be greater than about 0.10, greater than about 0.20, greater than about 0.30, greater than about 0.40, greater than about 0.5, greater than about 0.8, or greater than about 1.0.

At least a portion of diode output light entering the wavelength-converting layer 106 couples to the laterally propagating optical modes at the vacuum wavelength $\lambda_0$. Coupling of diode output light into those optical modes can increase the likelihood of entry of diode output light from the intermediate spacer 700 into the wavelength-converting layer 106. The presence of optical modes at the vacuum wavelengths $\lambda_0$ and $\lambda_1$ can increase the likelihood of absorption of diode output light and/or emission of down-converted light by the wavelength-converting layer 106, even in instances wherein the single-pass absorption (i.e., absorption of light propagating perpendicularly through the layer) of the wavelength-converting layer 106 is relatively low (e.g., due to reduced thickness, as discussed below). In some examples single-pass absorption exhibited at the vacuum wavelength $\lambda_0$ by the wavelength-converting layer 106 can be (i) greater than about 5%, greater than about 10%, greater than about 20%, or greater than about 33%, or (ii) less than about 50%, less than about 33%, or less than about 20%, or less than about 10%.

To increase the likelihood of diode output light exiting the diode structure 102 to enter the intermediate spacer 700, in some examples the front surface of the semiconductor layer 102c can have grooves, corrugations, protrusions, depression, or other non-planar surface features. Such surface features can enable an increased fraction of diode output light to exit the diode structure 102, relative to a similar diode structure having a planar front surface of the first semiconductor layer 102c.

In some examples the wavelength-converting layer 106 can be less than about 10 µm thick, less than about 5 µm thick, less than about 3.0 µm thick, less than about 2.0 µm thick, or less than about 1.0 µm thick. In some examples the optical waveguide formed by the wavelength-converting layer 106 can be arranged so as to support, at each of the vacuum wavelengths $\lambda_0$ and $\lambda_1$, at most 15, 10, 8, 5, 3, 2, or 1 laterally propagating optical modes. Those propagating optical modes supported by the wavelength-converting layer 106 that have qualitatively similar vertical intensity profiles (e.g., same numbers of peaks and nodes), regardless of lateral propagation direction or lateral intensity profile, shall be referred to collectively as only one mode among the supported optical modes. Reducing the number of optical modes can be advantageous for various reasons discussed below.

In some examples the wavelength-converting layer 106 can include a phosphor material that absorbs diode output light at the vacuum wavelength $\lambda_0$ and emits down-converted light at the vacuum wavelength $\lambda_1$. In some examples the wavelength-converting layer 106 can include a multitude of quantum dots of any suitable type or composition arranged in a layered or matrix structure or dispersed in a transparent solid medium; those quantum dots absorb diode output light at the vacuum wavelength $\lambda_0$ and emit down-converted light at the vacuum wavelength $\lambda_1$. Because of the reduced thickness of the wavelength-converting layer 106 needed or desired in some examples, some phosphor material might not be suitable. Some phosphor materials are available in the form of particles that can be several micron or several tens of microns in size; such particles would not be suitable for a wavelength-converting layer 106 thinner than their particle sizes. Quantum dots can be formed with sizes well under one micron, and are therefore suitable for use in a relatively thin wavelength-converting layer 106.

Examples of suitable quantum dots can include, e.g., II-VI quantum dots such as cadmium selenide, cadmium sulfide, or zinc or lead chalcogenides; III-V quantum dots such as indium phosphide, indium arsenide, gallium arsenide, or gallium phosphide; or metal halide perovskites. In some examples the quantum dots can be shelled or encased in other materials so as to alter their properties or to enhance their stability or reliability. Examples of suitable solid media can include, e.g., silicones or other polymers, sol-gel layers, or layers or binders formed by atomic layer deposition (ALD) or chemical vapor deposition (CVD). In some examples the wavelength-converting layer 106 including quantum dots, including colloidal quantum dots, can be formed by any one or more suitable techniques, e.g., Langmuir-Blodgett-type self-assembly techniques (e.g., as in Gole et al, *Langmuir* 24(15) 8181 (2008)), jet spray or other microspray techniques (e.g., as in Nguyen et al, *Optical Materials Express* 8(12) 3738 (2018)), or vapor deposition techniques such as CVD. Each of the references mentioned above is incorporated herein by reference in its entirety. Some of the techniques mentioned above might require a flat surface for acceptable results, while others can also be employed on surfaces having some topography.

Separation between the wavelength-converting layer 106 and the diode structure 102 (often equal to the thickness of the intermediate spacer 700) typically can be sufficiently large so as to prevent substantial spatial overlap of the one or more laterally propagating modes (supported by the wavelength-converting layer 106) with the diode structure 102. In some examples the separation between the wavelength-converting layer and the diode structure can be (i) less than about 20 µm thick, less than about 10 µm thick, less than about 5 µm thick, less than about 3.0 µm thick, less than about 2.0 µm thick, or less than about 1.0 µm thick, or (ii) greater than about 1.0 µm thick, greater than about 2.0 µm thick, greater than about 3.0 µm thick, greater than about 5 µm thick, or greater than about 10 µm thick.

In some examples the intermediate spacer 700 can comprise only a single layer of dielectric material that is transparent at the vacuum wavelength $\lambda_0$ with a refractive index less than that of the wavelength-converting layer, e.g., only a single layer of silicon dioxide. In some examples the intermediate spacer 700 can include multiple layers of one or more dielectric materials, each of the multiple dielectric layers being transparent at the vacuum wavelength $\lambda_0$ with a corresponding refractive index different from immediately adjacent layers; the effective refractive index of the multiple dielectric layers is less than that of the wavelength-converting layer 106, even if one or more individual dielectric layers have corresponding refractive indices higher than that.

In some examples the intermediate spacer 700 can include multiple dielectric layers arranged as a MLR structure, e.g., a DBR structure. In some examples the intermediate spacer 700 can include multiple dielectric layers arranged as a dichroic optical filter, a short-pass optical filter, a bandpass optical filter, or a notch optical filter.

In some examples the intermediate spacer 700 can include alternating layers of silicon oxide and titanium oxide, or alternating layers of silicon oxide and niobium oxide. In some examples the intermediate spacer 700 can include multiple dielectric layers arranged so as to exhibit (i) reflectance at the vacuum wavelength $\lambda_1$ greater than reflectance at the vacuum wavelength $\lambda_0$ or (ii) transmittance at the vacuum wavelength $\lambda_0$ greater than transmittance at the vacuum wavelength $\lambda_1$. Such arrangements can enable transmission of diode output light from the diode structure 102 into the wavelength-converting layer 106 while also reducing or eliminating transmission of down-converted light from the wavelength-converting layer 106 into the diode structure 102. Such arrangements can thereby increase the fraction of down-converted light that exits the front surface of the wavelength-converting layer 106 as device output light. In some examples the intermediate spacer 700 can include one or more materials among: doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

In some examples the intermediate spacer 700 can include a metal layer within the intermediate spacer 700. Such a metal layer can be less than about 0.10 µm thick, less than about 0.05 µm thick, less than about 0.020 µm thick, or less than about 0.010 µm thick, and can include one or more of aluminum, silver, gold, or other suitable metal or metal alloy. Such a metal layer can in some instances enhance the action as a waveguide of the wavelength-converting layer 106, in turn enhancing absorption of diode output light and emission of down-converted light. In such examples the metal layer can be sufficiently thick to enhance the waveguide action, but sufficiently thin so as not to absorb or reflect too much of the diode output light. Instead of or in addition to a metal layer within the wavelength-converting layer 106, in some examples the light-emitting device 100 can include a metal layer within an output optical structure 800 on the front surface of the wavelength-converting layer 106. As described above, in such examples the metal layer can be sufficiently thick to enhance the waveguide action, but sufficiently thin so as not to absorb too much of the diode output light or absorb or reflect too much of the down-converted light.

Figure 7:
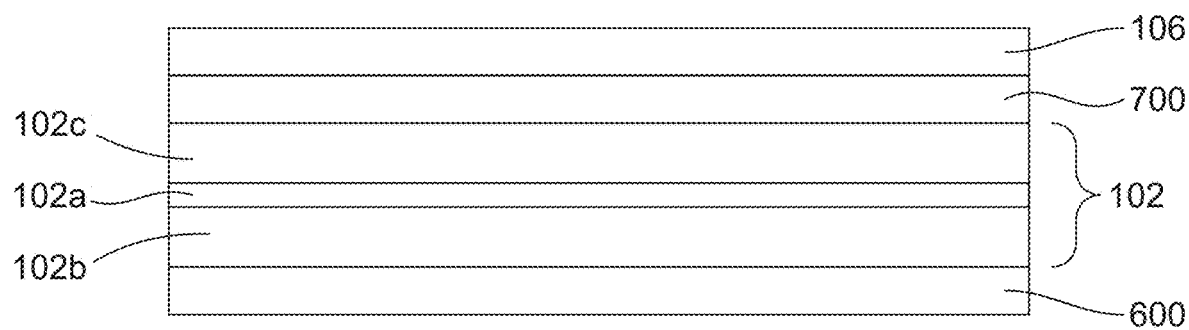
FIGS. 7 through 12B are schematic side cross-sectional views of several example arrangements of an inventive light-emitting device.

In the example illustrated schematically in FIG. 7, the inventive light-emitting device 100 includes the diode structure 102, the reflector 600, the intermediate spacer 700, and the wavelength-converting layer 106, each of those elements being arranged in any of the ways described above. The arrangement of FIG. 7 can in some instances also include a metal layer on one or both of the surfaces of the wavelength-converting layer 106, as described above. Down-converted light exits the device 100 (arranged as in FIG. 7) through the front surface of the wavelength-converting layer 106 (and any metal layer that may be present).

Figure 8:
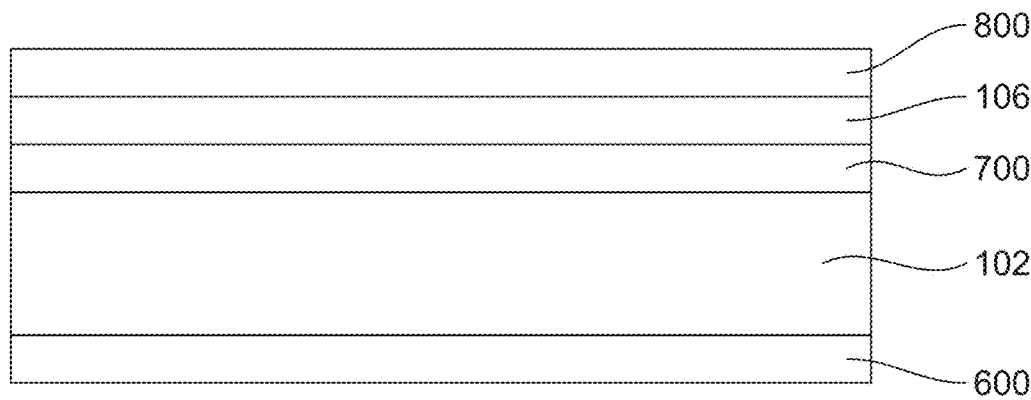

In the example illustrated schematically in FIG. 8, the inventive light-emitting device 100 also includes an output optical structure 800. The diode structure 102, the reflector 600, the intermediate spacer 700, and the wavelength-converting layer 106 can be arranged in any of the ways described above, including in some examples a metal layer on one or both surfaces of the wavelength-converting layer 106. The output optical structure 800 is positioned on the front surface of the wavelength-converting layer 106, and can be formed using any one or more suitable fabrication techniques. Down-converted light exits the device 100 after propagating though the output optical structure 800 and exiting through its front surface. The output optical structure 800 has an effective refractive index less than a refractive index of the wavelength-converting layer 106. In some examples the effective refractive index of the output optical structure 800 can be about equal to the effective refractive index of the intermediate spacer 700. Just as the intermediate spacer acts as lower cladding for the waveguide formed by the wavelength-converting layer 106, the output optical structure 800 acts as upper cladding. The resulting more-nearly-symmetric index profile around the waveguide results in greater spatial overlap of the supported optical modes with the wavelength-converting layer 106. That greater spatial overlap can improve one or both of (i) coupling of diode output light into the optical modes supported by the wavelength-converting layer 106, or (ii) absorption of diode output light by the wavelength-converting layer 106 and conversion to down-converted light.

In some examples the output optical structure 800 can be (i) less than about 20. µm thick, less than about 10. µm thick, less than about 5 µm thick, less than about 3.0 µm thick, less than about 2.0 µm thick, or less than about 1.0 µm thick, or (ii) greater than about 1.0 µm thick, greater than about 2.0 µm thick, greater than about 3.0 µm thick, greater than about 5 µm thick, or greater than about 10. µm thick. In some examples the output optical structure 800 can comprise only a single layer of dielectric material that is transparent at the vacuum wavelength $\lambda_1$ with a refractive index less than that of the wavelength-converting layer 106, e.g., only a single layer of silicon dioxide. In some examples the output optical structure 800 can include multiple dielectric layers, each of the multiple dielectric layers being transparent at the vacuum wavelength $\lambda_1$ with a corresponding refractive index different from immediately adjacent layers; the effective refractive index of the multiple dielectric layers is less than that of the wavelength-converting layer 106, even if one or more individual dielectric layers have corresponding refractive indices higher than that.

In some examples the output optical structure 800 can include multiple dielectric layers arranged as a MLR structure, e.g., a DBR structure. In some examples the output optical structure 800 can include multiple dielectric layers arranged as a dichroic optical filter, a long-pass optical filter, a bandpass optical filter, or a notch optical filter. In some examples the output optical structure 800 can include alternating layers of silicon oxide and titanium oxide, or alternating layers of silicon oxide and niobium oxide. In some examples the output optical structure 800 can include multiple dielectric layers arranged so as to exhibit (i) reflectance at the vacuum wavelength $\lambda_0$ greater than reflectance at the vacuum wavelength $\lambda_1$ or (ii) transmittance at the vacuum wavelength $\lambda_1$ greater than transmittance at the vacuum wavelength $\lambda_0$. Such arrangements can enable transmission of down-converted light through the output optical structure 800 to exit the device 100 while also reducing or eliminating escape of diode output light from the wavelength-converting layer 106 to exit the device 100. Such arrangements can thereby reduce or eliminate the fraction of diode output light transmitted through the front surface of the wavelength-converting layer 106 to escape the device 100. In some examples the output optical structure 800 can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

As noted above, in some examples the output optical structure 800 can include a metal layer within the output optical structure 800. Such a metal layer can be less than about 0.10 µm thick, less than about 0.05 µm thick, less than about 0.020 µm thick, or less than about 0.010 µm thick, and can include one or more of aluminum, silver, gold, or other suitable metal or metal alloy. As noted above, such a metal layer can in some instances enhance the action as a waveguide of the wavelength-converting layer, in turn enhancing absorption of diode output light and emission of down-converted light. In such examples the metal layer is sufficiently thick to enhance the waveguide action, but sufficiently thin so as not to absorb too much of the diode output light or absorb or reflect too much of the down-converted light.

Figure 9A:
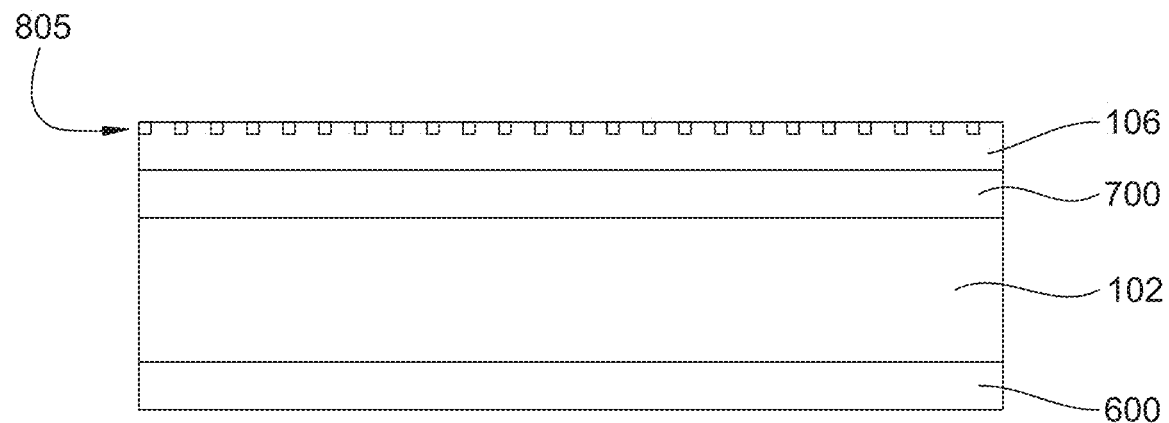
Figure 9B:
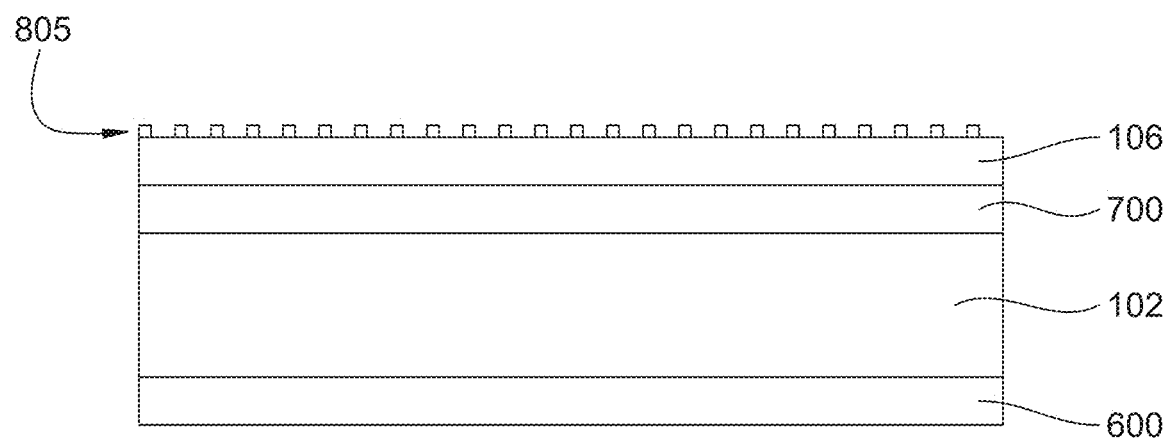
Figure 10A:
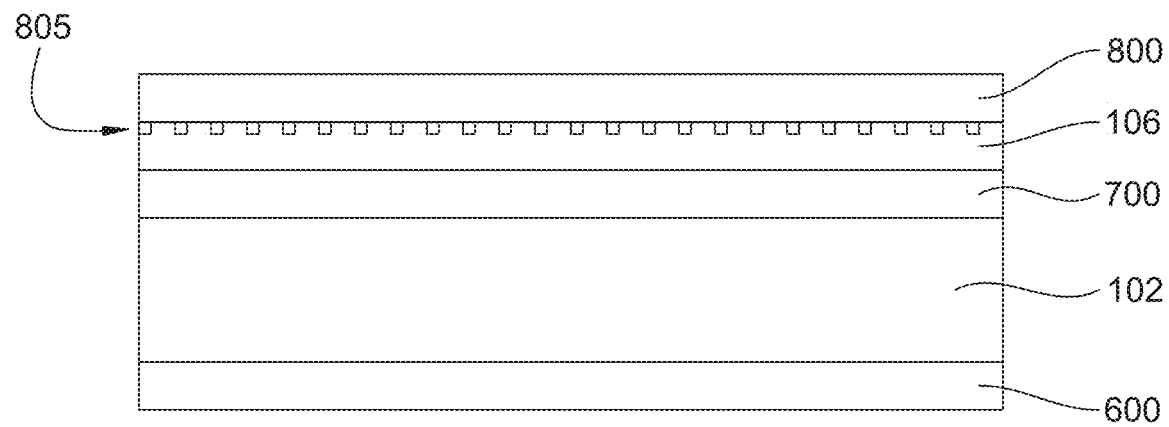
Figure 10B:
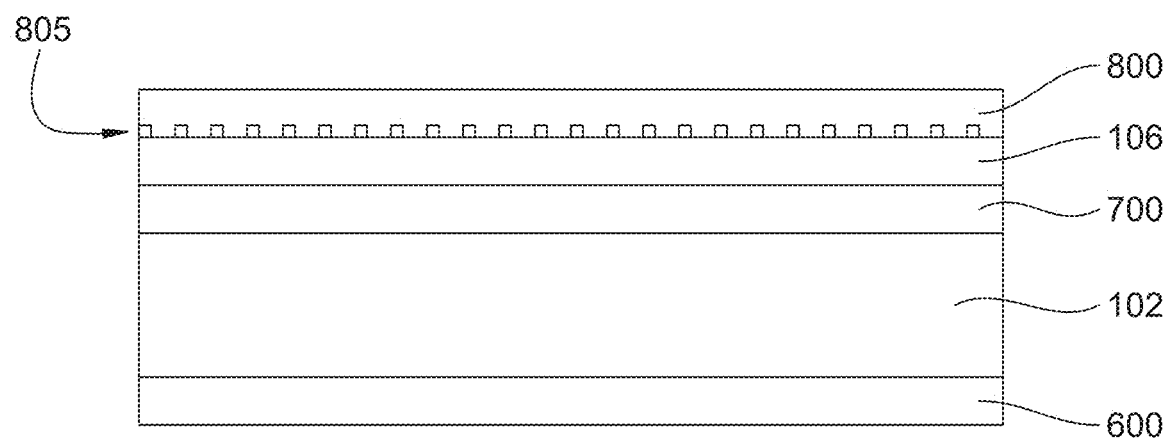

In the examples illustrated schematically in FIGS. 9A-10B, an inventive light-emitting device 100 can include a front array of micro- or nano-structured scattering elements 805 at the front surface of the wavelength-converting layer 106 (e.g., in some examples arranged in a manner similar to that illustrated schematically in FIGS. 13A-13E). In the examples of FIGS. 9A and 9B no output optical structure 800 is present; in the examples of FIGS. 10A and 10B an output optical structure 800 is present. "At the front surface of the wavelength-converting layer 106" indicates that the scattering elements 805 are within near-field proximity to that surface. The scattering elements 805 can be formed using any one or more suitable fabrication techniques, and can (i) protrude from the front surface into the wavelength-converting layer 106 (as in FIGS. 9A and 10A), (ii) protrude from the front surface away from the wavelength-converting layer 106 (as in FIGS. 9B and 10B; into the output optical structure 800 in FIG. 10B), (iii) protrude both into and away from the surface of the wavelength-converting layer 106 (not shown), (iv) be entirely enclosed by the wavelength-converting layer 106 (not shown), or (v) be entirely enclosed within the output optical structure 800 if present (not shown). The scattering elements 805 can be arranged collectively so as to redirect at least a portion of the down-converted light propagating in or through the wavelength-converting layer 106 to exit through the front surface of the wavelength-converting layer 106.

Suitable arrangement of the scattering elements 805 at the front surface of the wavelength-converting layer 106 can be employed to provide enhanced directionality of the down-converted light exiting the device 100. Without the scattering elements 805, the exiting down-converted light is relatively non-directional, perhaps approximating a Lambertian distribution in which about half of the down-converted light propagates within a solid angle of about 1.8 steradians (sr). In examples employing a front array of scattering elements 805, at least half of the down-converted light that exits through the front surface of the wavelength-converting layer 106 can propagate away from the device 100 within a solid angle less than about 1.5 sr, less than about 1.2 sr, less than about 1.0 sr, less than about 0.8 sr, less than about 0.5 sr, less than about 0.20 sr, less than about 0.10 sr, or even smaller. In examples employing a front array of scattering elements 805, more than about 55.%, more than about 60.%, more than about 65.%, more than 70.%, more than about 75.%, more than about 80.%, or even higher, of the down-converted light that exits through the front surface of the wavelength-converting layer 106 can propagate away from the device within a solid angle less than about 1.8 sr.

In some examples the scattering elements 805 of the front array can include, formed on or in the wavelength-converting layer 106, a multitude of suitably sized and shaped projections, holes, depressions, inclusions, or structures. In some examples the scattering elements 805 of the front array can include, formed on or in the wavelength-converting layer, an array of nano-antennae, a partial photonic bandgap structure, a photonic crystal, or an array of meta-atoms or meta-molecules, arranged collectively so as to redirect at least a portion of the down-converted light propagating in or through the wavelength-converting layer 106 to exit through the front surface of the wavelength-converting layer 106. In some examples the micro- or nano-structured scattering elements 805 of the front array can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

In some examples the scattering elements 805 can include an array of single nano-antennae, or double nano-antennae (i.e., dimers), that include one or more antenna materials, are shaped, sized, and spaced relative to the vacuum wavelength $1i$, and arranged to achieve the redirection of down-converted light. In some examples the scattering elements 805 can include a partial photonic bandgap structure arranged with one or more materials, morphology, and spacing relative to the vacuum wavelength $\lambda_1$ to achieve the redirection of the down-converted light. In some examples the scattering elements 805 can include a photonic crystal arranged with one or more materials, crystal morphology, and crystal-lattice spacing relative to the vacuum wavelength $\lambda_1$ to achieve the redirection of the down-converted light. In some examples the scattering elements 805 can include an array of meta-atoms or meta-molecules that include one or more meta-materials, are shaped, sized, and spaced relative to the vacuum wavelength $\lambda_1$, and are arranged to achieve the redirection of the down-converted light. In some examples the scattering elements 805 can be arranged as a surface-lattice-resonance (SLR) structure supporting one or more SLR optical modes at the vacuum wavelength $\lambda_1$. In some examples the size or spacing of the micro- or nano-structured scattering elements 805 of the front array can be less than about $\lambda_1/n_C$, less than about $\lambda_1/2n_C$, less than about $\lambda_1/4n_C$, or less than about $\lambda_1/10n_C$.

In some examples the micro- or nano-structured scattering elements 805 of the front array can be arranged as a periodic array, e.g., a rectangular, hexagonal, or trigonal array. In some examples the micro- or nano-structured scattering elements 805 of the front array can be arranged in an irregular or aperiodic arrangement.

Figure 11A:
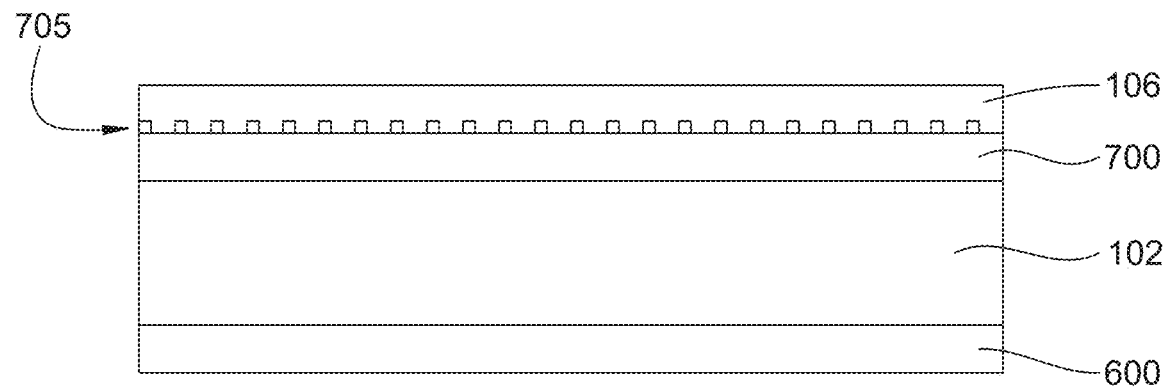
Figure 11B:
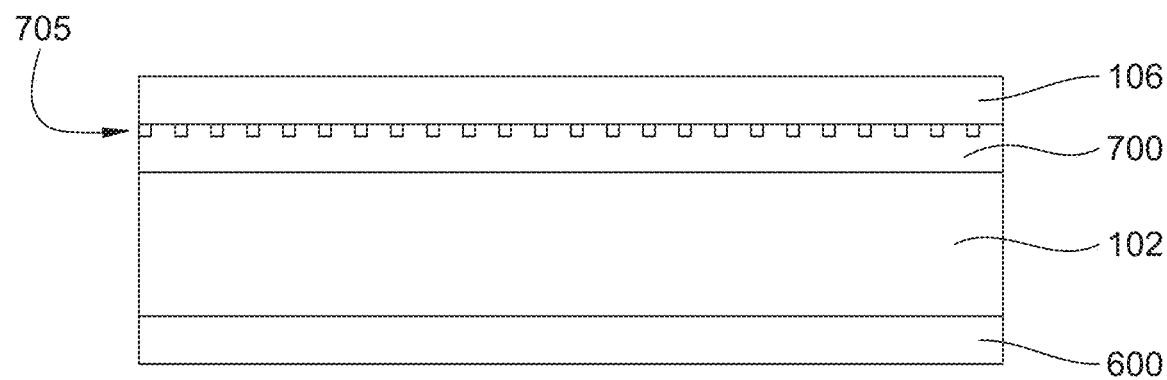
Figure 12A:
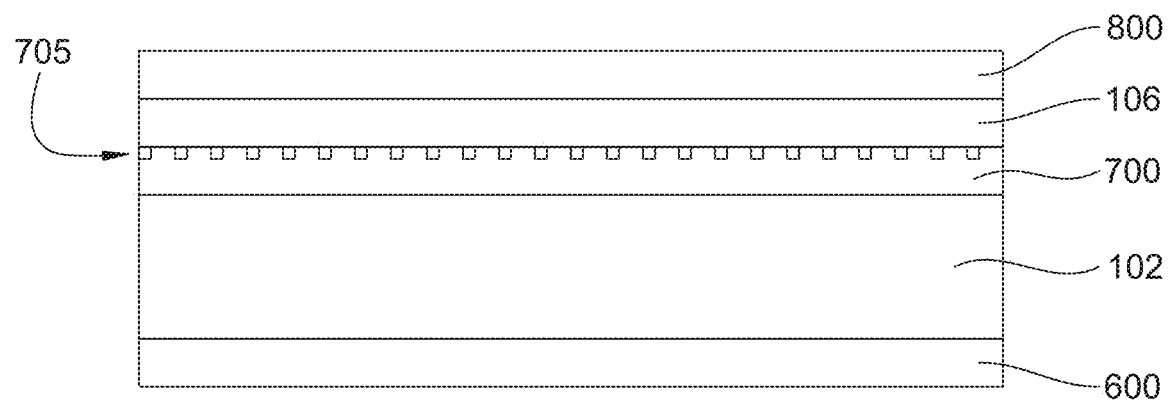
Figure 12B:
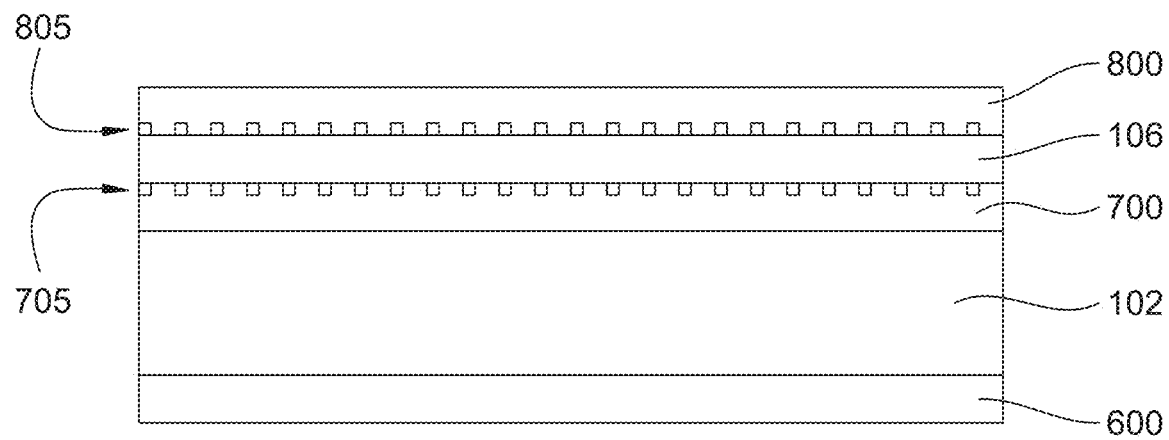
Figure 13A:
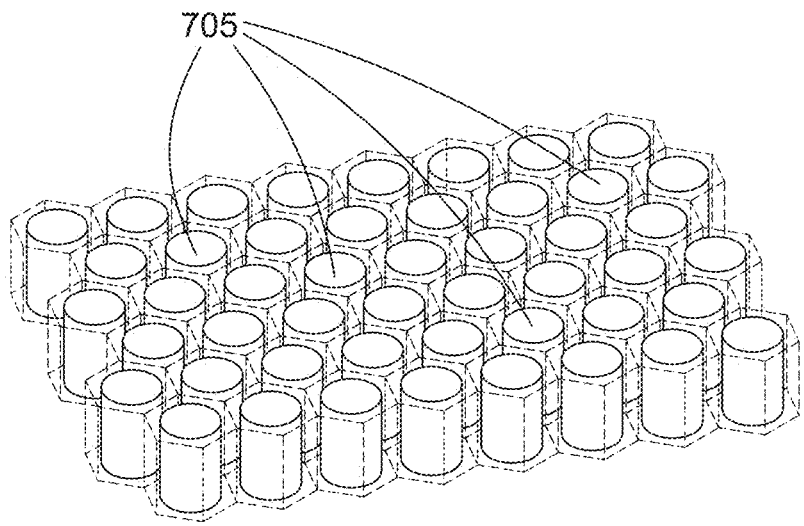
FIG. 13A is an enlarged schematic representation of an example of a set of micro- or nano-structured scattering elements.
Figure 13B:
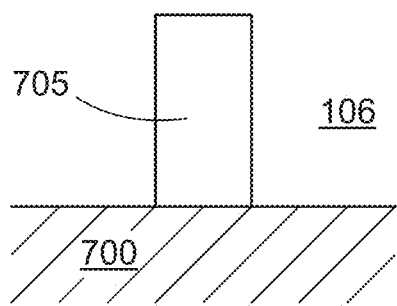
FIGS. 13B-13E illustrate schematically different examples of individual micro- or nano-structured scattering elements (at the back surface protruding into the wavelength-converting layer in the examples shown)
Figure 13C:
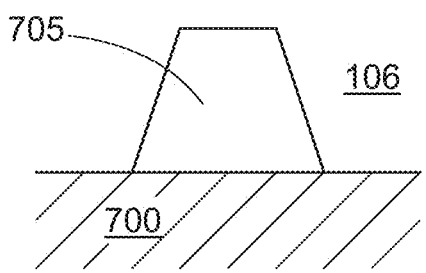
Figure 13D:
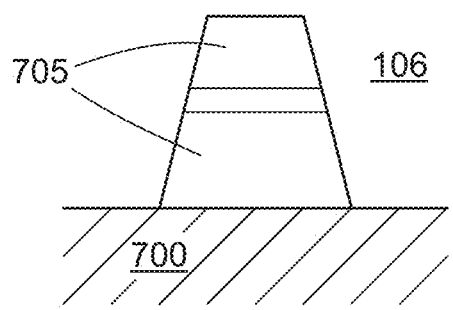
Figure 13E:
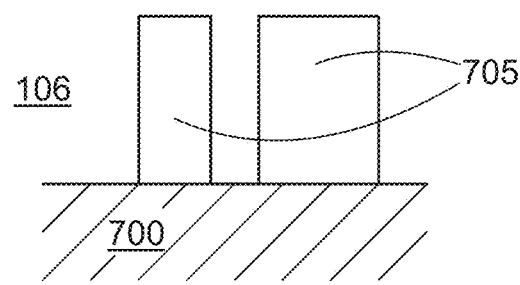

In the examples illustrated schematically in FIGS. 11A-12B, an inventive light-emitting device 100 can include a back array of micro- or nano-structured scattering elements 705 at the back surface of the wavelength-converting layer 106 (e.g., in some examples arranged as illustrated schematically in FIGS. 13A-13E). In the examples of FIGS. 11A and 11B no output optical structure 800 is present; in the examples of FIGS. 12A and 12B an output optical structure 800 is present, and a front array of scattering elements 805 is present in FIG. 12B. "At the back surface of the wavelength-converting layer 106" indicates that the scattering elements 705 are within near-field proximity to that surface. The scattering elements 705 can be formed using any one or more suitable fabrication techniques, and can (i) protrude from the back surface into the wavelength-converting layer 106 (as in FIG. 11A), (ii) protrude from the back surface away from the wavelength-converting layer 106 into the intermediate spacer 700 (as in FIGS. 11B, 12A, and 12B), (iii) protrude both into and away from the surface of the wavelength-converting layer 106 (not shown), (iv) be entirely enclosed by the wavelength-converting layer 106 (not shown), or (v) be entirely enclosed within the intermediate spacer 700 (not shown). The scattering elements 705 can be arranged collectively so as to optically couple at least a portion of the diode output light propagating in or through the intermediate spacer 700 into one or more of the laterally propagating optical modes.

In some examples the scattering elements 705 of the back array can include, formed on or in the wavelength-converting layer 106, a multitude of suitably sized and shaped projections, holes, depressions, inclusions, or structures. In some examples the scattering elements 705 of the back array can include, formed on or in the wavelength-converting layer, an array of nano-antennae, a partial photonic bandgap structure, a photonic crystal, or an array of meta-atoms or meta-molecules, arranged collectively so as to optically couple at least a portion of the diode output light propagating in or through the intermediate spacer 700 into one or more of the laterally propagating optical modes. In some examples the micro- or nano-structured scattering elements 705 of the back array can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

In some examples the scattering elements 705 can include an array of single nano-antennae, or double nano-antennae (i.e., dimers), that include one or more antenna materials, are shaped, sized, and spaced relative to the vacuum wavelength $\lambda_0$, and arranged to achieve the optical coupling of diode output light. In some examples the scattering elements 705 can include a partial photonic bandgap structure arranged with one or more materials, morphology, and spacing relative to the vacuum wavelength $\lambda_0$ to achieve the optical coupling of diode output light. In some examples the scattering elements 705 can include a photonic crystal arranged with one or more materials, crystal morphology, and crystal-lattice spacing relative to the vacuum wavelength $\lambda_0$ to achieve the optical coupling of diode output light. In some examples the scattering elements 705 can include an array of meta-atoms or meta-molecules that include one or more meta-materials, are shaped, sized, and spaced relative to the vacuum wavelength $\lambda_0$, and are arranged to achieve the optical coupling of diode output light. In some examples the scattering elements 705 can be arranged as a surface-lattice-resonance (SLR) structure supporting one or more SLR optical modes at the vacuum wavelength $\lambda_0$. In some examples the size or spacing of the micro- or nano-structured scattering elements 805 of the front array can be less than about $\lambda_0/n_S$, less than about $\lambda_0/2n_S$, less than about $\lambda_0/4n_S$, or less than about $\lambda_0/10n_S$.

In some examples the micro- or nano-structured scattering elements 705 of the back array can be arranged as a periodic array, e.g., a rectangular, hexagonal, or trigonal array. In some examples the micro- or nano-structured scattering elements 705 of the back array can be arranged in an irregular or aperiodic arrangement.

Design or optimization one or more or all of the diode structure 102, the reflector 600, the intermediate spacer 700, the wavelength-converting layer 106, the output optical structure 800 (if present), the back array of scattering elements 705 (if present), the front array of scattering elements 805 (if present), or any metal layers (if present) can be performed (by calculation, simulation, or iterative designing/making/testing of prototypes or test devices) based on one or more selected figures-of-merit (FOMs). Device-performance-based FOMs that can be considered can include, e.g.: (i) overall efficiency of down-converted light emission relative to input electrical current; (ii) efficiency of down-converted light emission relative to diode output light emission; (iii) radiated emission angular distribution of the down-converted light; (iv) ratio of down-converted light to diode output light exiting the device; (v) for an array of multiple devices (discussed below), contrast ratio between adjacent devices for down-converted light emission, or (vi) other suitable or desirable FOMs. Instead or in addition, reduction of cost or manufacturing complexity can be employed as an FOM in a design or optimization process. Optimization for one FOM can result in non-optimal values for one or more other FOMs. Note that a device that is not necessarily fully optimized with respect to any FOM can nevertheless provide acceptable enhancement of one or more FOMs; such partly optimized devices fall within the scope of the present disclosure or appended claims.

In some examples, a ratio of optical power exiting the wavelength-converting layer 106 to propagate away from the light-emitting device 100 at the vacuum wavelengths $\lambda_1$ and $\lambda_0$, respectively, is greater than 1:1, greater than 2:1, greater than 3:1, greater than 5:1, greater than 10:1, greater than 20:1, greater than 50:1, or greater than 100:1. In some examples, quantum efficiency of conversion of diode output light entering the wavelength-converting layer 106 into down-converted light exiting the wavelength-converting layer 106 is greater than about 20%, greater than about 33%, greater than about 50%, greater than about 75%, or greater than about 90%.

The arrangements described above for various examples of an inventive light-emitting device 100 can be advantageously employed in an array of multiple such devices, including in any of the array and device arrangements described above. As device pitch or spacing decreases, e.g., to 100 μm, 50 μm, or even less, the thickness of any wavelength-converting structure typically must decrease as well. In many instances a conventional phosphor material perhaps several tens of microns thick is needed to provide sufficient absorption of diode output light. As device pitch or spacing of an array decreases below 100 μm, such a thick wavelength-converting structure often causes unacceptably large cross-talk between adjacent devices (i.e., unacceptably low contrast ratio). In some instances, producing a sufficiently thick phosphor layer having sufficiently small transverse dimensions is problematic or impossible. Using a relatively thin wavelength-converting layer 106 can mitigate those issues, at the expense of decreased absorption of diode output light. Various of the inventive arrangements described herein (e.g., the wavelength-converting layer arranged to support only a limited number of laterally propagating optical modes, enhanced optical coupling of diode output light into those modes, reduced transmission of down-converted light into the diode structure 102, or reduced transmission of diode output light through the front surface of the wavelength-converting layer 106) enable sufficient emission of down-converted light from the device while employing a relatively thin wavelength-converting layer 106.

An inventive array can include multiple light-emitting devices 100 of any of the arrangements described above. The devices 100 of the array can be integrally formed together on a common substrate, or can be formed individually and assembled into an array. In some examples, each inventive light-emitting device 100 of the array can be operable independently of other light-emitting devices 100 of the array. In some examples, the light-emitting devices 100 of the array can exhibit a contrast ratio for down-converted light exiting from adjacent devices that is greater than 5:1, greater than 10:1, greater than 20:1, greater than 50:1, greater than 100:1, or greater than 300:1. In some examples, device pitch (i.e., spacing) of the light-emitting devices of the array can be less than about 1.0 mm, less than about 0.50 mm, less than about 0.33 mm, less than about 0.20 mm, less than about 0.10 mm, less than about 0.08 mm, less than about 0.05 mm, less than about 0.033 mm, or less than about 0.020 mm.

In some examples, individual diode structures 102 of the array can be separated from one another, e.g., by trenches or streets that interrupt electrical continuity between one or more of the layers 102a/102b/102c of adjacent diode structures 102. Such trenches or streets can be empty, or can be at least partly filled with electrically insulating material. In some examples, the layers 102a/102b/102c can be continuous across multiple devices 100 of the array, with individual diode structures 102 defined by corresponding localized electrode structures (electrically insulated from each other) for each diode structure 102. Such an arrangement is disclosed in, e.g., U.S. provisional App. No. 63/168,637 filed 31 Mar. 2021, which is incorporated herein by reference in its entirety.

In some examples reflectors 600 of the array can be separated from one another, e.g., by trenches or streets that separate the reflectors 700 of adjacent devices 100. Such trenches or streets can be empty, or can be at least partly filled with material, e.g., for reducing lateral optical transmission between adjacent devices 100 of the array or, if the reflector includes one or more layers that act as an electrode, for electrically insulating adjacent devices from one another. In some other examples the reflector 600, or at least electrical non-conductive portions thereof, can be continuous across multiple devices 100 of the array.

In some examples individual wavelength-converting layers 106 of the array can be separated from one another, e.g., by trenches or streets that separate the wavelength-converting layers 106 of adjacent devices 100. Such trenches or streets can be empty, or can be at least partly filled with material, e.g., for reducing lateral optical transmission between adjacent devices 100 of the array. In some other examples the wavelength-converting layer 106 can be continuous across multiple devices 100 of the array.

In some examples individual intermediate spacers 700 of the array can be separated from one another, e.g., by trenches or streets that separate the intermediate spacers 700 of adjacent devices 100. Such trenches or streets can be empty, or can be at least partly filled with material, e.g., for reducing lateral optical transmission between adjacent devices 100 of the array. In some other examples the intermediate spacer 700 can be continuous across multiple devices 100 of the array. Similarly, in some examples individual output spacers 800 of the array can be separated from one another, while in other examples the output optical structure 800 can be continuous across multiple devices 100 of the array.

In addition to the preceding, the following example embodiments fall within the scope of the present disclosure or appended claims:

Example 1. A semiconductor light-emitting device comprising: (a) a semiconductor diode structure including first and second doped semiconductor layers and an active layer between a back surface of the first semiconductor layer and a front surface of the second semiconductor layer, the active layer being arranged for emitting diode output light, resulting from electrical current flow through the diode structure, at a nominal emission vacuum wavelength $\lambda_0$ to propagate within the diode structure; (b) a reflector positioned against a back surface of the second semiconductor layer that internally reflects diode output light incident thereon from within the diode structure; (c) a wavelength-converting layer positioned with a back surface thereof facing and spaced-apart from a front surface of the first semiconductor layer, the wavelength-converting layer absorbing diode output light at the vacuum wavelength $\lambda_0$ and in response emitting down-converted light at a vacuum wavelength $\lambda_1$ that is greater than $\lambda_0$, at least a portion of the down-converted light exiting the wavelength-converting layer through a front surface thereof; and (d) an intermediate spacer positioned between the front surface of the first semiconductor layer and the back surface of the wavelength-converting layer and comprising one or more dielectric layers, each dielectric layer of the intermediate spacer being at least partly transparent at the vacuum wavelength $\lambda_0$, the intermediate spacer having an effective refractive index $n_S$ less than an effective refractive index $n_C$ of the wavelength-converting layer so that the wavelength-converting layer acts as an optical waveguide supporting one or more laterally propagating optical modes at the vacuum wavelengths $\lambda_0$ and $\lambda_1$.

Example 2. The device of Example 1, the intermediate spacer being positioned directly against one or both of the front surface of the first semiconductor layer and the back surface of the wavelength-converting layer.

Example 3. The device of any one of Examples 1 or 2, the diode structure, reflector, intermediate spacer, and wavelength-converting layer being arranged so that (i) at least a portion of the diode output light exits the diode structure through the front surface of the first semiconductor layer, propagates through the intermediate spacer, enters the wavelength-converting layer, and is absorbed by the wavelength-converting layer, and (ii) at least a portion of the down-converted light emitted by the wavelength-converting layer in response to absorption of diode output light exits the wavelength-converting layer through the front surface thereof.

Example 4. The device of any one of Examples 1 through 3, the vacuum wavelength $\lambda_0$ being greater than about 0.20 µm, greater than about 0.4 µm, greater than about 0.8 µm, less than about 10. µm, less than about 2.5 µm, or less than about 1.0 µm.

Example 5. The device of any one of Examples 1 through 4, single-pass absorption exhibited at the vacuum wavelength $\lambda_0$ by the wavelength-converting layer is (i) greater than about 5%, greater than about 10%, greater than about 20%, or greater than about 33%, or (ii) less than about 50%, less than about 33%, or less than about 20%, or less than about 10%.

Example 6. The device of any one of Examples 1 through 5, a ratio of optical power exiting the wavelength-converting layer to propagate away from the device at the vacuum wavelengths $\lambda_1$ and $\lambda_0$ is greater than 1:1, greater than 2:1, greater than 3:1, greater than 5:1, greater than 10:1, greater than 20:1, greater than 50:1, or greater than 100:1.

Example 7. The device of any one of Examples 1 through 6, quantum efficiency of conversion of diode output light entering the wavelength-converting layer into down-converted light exiting the wavelength-converting layer is greater than about 20%, greater than about 33%, greater than about 50%, greater than about 75%, or greater than about 90%.

Example 8. The device of any one of Examples 1 through 7, the front surface of the first semiconductor layer having grooves, corrugations, protrusions, depression, or other non-planar surface features arranged so as to enable an increased fraction of diode output light to exit the diode structure, relative to a similar diode structure having a planar front surface of the first semiconductor layer.

Example 9. The device of any one of Examples 1 through 8, the wavelength-converting layer being less than about 10. µm thick, less than about 5 µm thick, less than about 3.0 µm thick, less than about 2.0 µm thick, or less than about 1.0 µm thick.

Example 10. The device of any one of Examples 1 through 9, the optical waveguide being arranged so as to support, at each of the vacuum wavelengths $\lambda_0$ and $\lambda_1$, at most 15, 10, 8, 5, 3, 2, or 1 laterally propagating optical modes.

Example 11. The device of any one of Examples 1 through 10, the wavelength-converting layer including a phosphor material that absorbs diode output light at the vacuum wavelength $\lambda_0$ and emits down-converted light at the vacuum wavelength $\lambda_1$.

Example 12. The device of any one of Examples 1 through 11, the wavelength-converting layer including a multitude of quantum dots arranged in a layer or matrix structure or dispersed in a transparent solid medium, the quantum dots absorbing diode output light at the vacuum wavelength $\lambda_0$ and emitting down-converted light at the vacuum wavelength $\lambda_1$.

Example 13. The device of Example 12, the quantum dots including one or more materials among cadmium selenide, cadmium sulfide, zinc or lead chalcogenides, other one or more II-VI materials, indium phosphide, indium arsenide, gallium arsenide, gallium phosphide, other one or more III-V materials, or one or more metal halide perovskites.

Example 14. The device any one of Examples 1 through 13, the wavelength-converting layer exhibiting an effective refractive index greater than about 1.5, greater than about 1.6, greater than about 1.7, greater than about 1.8, greater than about 1.9, greater than about 2.0, greater than about 2.2, or greater than about 2.4.

Example 15. The device any one of Examples 1 through 14, the intermediate spacer exhibiting an effective refractive index less than about 2.3, less than about 2.1, less than about 1.9, less than about 1.8, less than about 1.7, less than about 1.6, less than about 1.5, or less than about 1.4.

Example 16. The device any one of Examples 1 through 15, magnitude of a difference of effective refractive indices between the wavelength-converting layer and the intermediate spacer being greater than about 0.10, greater than about 0.20, greater than about 0.30, greater than about 0.40, greater than about 0.5, greater than about 0.8, or greater than about 1.0.

Example 17. The device of any one of Examples 1 through 16, separation between the wavelength-converting layer and the diode structure being sufficiently large so as to prevent substantial spatial overlap of the one or more laterally propagating modes with the diode structure.

Example 18. The device of any one of Examples 1 through 17, separation between the wavelength-converting layer and the diode structure being (i) less than about 20. µm, less than about 10. µm, less than about 5 µm, less than about 3.0 µm, less than about 2.0 µm, or less than about 1.0 µm, or (ii) greater than about 1.0 µm, greater than about 2.0 µm, greater than about 3.0 µm, greater than about 5 µm, or greater than about 10. µm.

Example 19. The device of any one of Examples 1 through 18, the intermediate spacer including multiple layers of one or more dielectric materials, each of the multiple layers being transparent at the vacuum wavelength $\lambda_0$ with a corresponding refractive index different from immediately adjacent layers.

Example 20. The device of any one of Examples 1 through 19, the intermediate spacer including multiple layers of one or more dielectric materials arranged as a multi-layer-reflector (MLR) structure.

Example 21. The device of any one of Examples 1 through 20, the intermediate spacer including multiple layers of one or more dielectric materials arranged as a dichroic optical filter, a short-pass optical filter, a bandpass optical filter, or a notch optical filter.

Example 22. The device of any one of Examples 1 through 21, the intermediate spacer including multiple layers of one or more dielectric materials arranged so as to exhibit (i) reflectance at the vacuum wavelength $\lambda_1$ greater than reflectance at the vacuum wavelength $\lambda_0$ or (ii) transmittance at the vacuum wavelength $\lambda_0$ greater than transmittance at the vacuum wavelength $\lambda_1$.

Example 23. The device of any one of Examples 1 through 22, the intermediate spacer including alternating layers of silicon oxide and titanium oxide, or alternating layers of silicon oxide and niobium oxide.

Example 24. The device of any one of Examples 1 through 18, the intermediate spacer comprising only a single layer of dielectric material that is transparent at the vacuum wavelength $\lambda_0$ with a refractive index less than that of the wavelength-converting layer.

Example 25. The device of Example 24, the intermediate spacer comprising only a single layer of silicon dioxide.

Example 26. The device of any one of Examples 1 through 24, the intermediate spacer including one or more materials among: doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 27. The device of any one of Examples 1 through 26, further comprising a metal layer within the intermediate spacer or between the intermediate spacer and the wavelength-converting layer.

Example 28. The device of Example 27, the metal layer being less than about 0.10 µm thick, less than about 0.05 µm thick, less than about 0.020 µm thick, or less than about 0.010 µm thick.

Example 29. The device of any one of Examples 27 or 28, the metal layer including one or more of aluminum, silver, gold, or other suitable metal or metal alloy.

Example 30. The device of any one of Examples 1 through 29, further comprising a front array of micro- or nano-structured scattering elements at the front surface of the wavelength-converting layer, the scattering elements of the front array being arranged collectively so as to redirect at least a portion of the down-converted light propagating in or through the wavelength-converting layer to exit through the front surface of the wavelength-converting layer.

Example 31. The device of Example 30, the micro- or nano-structured scattering elements of the front array including, formed on or in the wavelength-converting layer, a multitude of suitably sized and shaped projections, holes, depressions, inclusions, or structures.

Example 32. The device of any one of Examples 30 or 31, the micro- or nano-structured scattering elements of the front array including, formed on or in the wavelength-converting layer, an array of nano-antennae, a partial photonic bandgap structure, a photonic crystal, or an array of meta-atoms or meta-molecules.

Example 33. The device of Example 32, the micro- or nano-structured scattering elements of the front array including an array of single nano-antennae, or double nano-antennae (i.e., dimers), that include one or more antenna materials, are shaped, sized, and spaced relative to the vacuum wavelength $\lambda_1$, and are arranged so as to redirect at least a portion of the down-converted light propagating in or through the wavelength-converting layer to exit through the front surface of the wavelength-converting layer.

Example 34. The device of any one of Examples 32 or 33, the micro- or nano-structured scattering elements of the front array including a partial photonic bandgap structure arranged with one or more materials, morphology, and spacing relative to the vacuum wavelength $\lambda_1$, so as to redirect at least a portion of the down-converted light propagating in or through the wavelength-converting layer to exit through the front surface of the wavelength-converting layer.

Example 35. The device of any one of Examples 32 through 34, the micro- or nano-structured scattering elements of the front array including a photonic crystal arranged with one or more materials, crystal morphology, and crystal-lattice spacing relative to the vacuum wavelength $\lambda_1$, so as to redirect at least a portion of the down-converted light propagating in or through the wavelength-converting layer to exit through the front surface of the wavelength-converting layer.

Example 36. The device of any one of Examples 32 through 35, the micro- or nano-structured scattering elements of the front array including an array of meta-atoms or meta-molecules that include one or more meta-materials, are shaped, sized, and spaced relative to the vacuum wavelength $\lambda_1$, and are arranged so as to redirect at least a portion of the down-converted light propagating in or through the wavelength-converting layer to exit through the front surface of the wavelength-converting layer.

Example 37. The device of any one of Examples 30 through 36, the micro- or nano-structured scattering elements of the front array being arranged as a surface-lattice-resonance (SLR) structure supporting one or more SLR optical modes at the vacuum wavelength $\lambda_1$.

Example 38. The device of any one of Examples 30 through 37, size or spacing of the micro- or nano-structured scattering elements of the front array being less than about $\lambda_1/n_C$, less than about $\lambda_1/2n_C$, less than about $\lambda_1/4n_C$, or less than about a $\lambda_1/10n_C$.

Example 39. The device of any one of Examples 30 through 38, the micro- or nano-structured scattering elements of the front array including one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 40. The device of any one of Examples 30 through 39, the micro- or nano-structured scattering elements of the front array being arranged as a periodic array.

Example 41. The device of Example 40, the periodic array being a rectangular, hexagonal, or trigonal array.

Example 42. The device of any one of Examples 30 through 39, the micro- or nano-structured scattering elements of the front array being arranged in an irregular or aperiodic arrangement.

Example 43. The device of any one of Examples 1 through 42, further comprising a front metal layer on the front surface of the wavelength-converting layer.

Example 44. The device of Example 43, the front metal layer being less than about 0.10 µm thick, less than about 0.05 µm thick, less than about 0.020 µm thick, or less than about 0.010 µm thick.

Example 45. The device of any one of Examples 43 or 44, the front metal layer including one or more of aluminum, silver, gold, or other suitable metal or metal alloy.

Example 46. The device of any one of Examples 1 through 45, at least half of the down-converted light that exits through the front surface of the wavelength-converting layer propagates away from the device within a solid angle less than about 1.5 sr, less than about 1.2 sr, less than about 1.0 sr, less than about 0.8 sr, less than about 0.5 sr, less than about 0.20 sr, less than about 0.10 sr, or even smaller.

Example 47. The device of any one of Examples 1 through 46, more than about 55.%, more than about 60.%, more than about 65.%, more than 70.%, more than about 75.%, more than about 80.%, or even higher, of the down-converted light that exits through the front surface of the wavelength-converting layer propagates away from the device within a solid angle less than about 1.8 sr.

Example 48. The device of any one of Examples 1 through 47, further comprising an output optical structure positioned on a front surface of the wavelength-converting layer, the output optical structure having an effective refractive index less than a refractive index of the wavelength-converting layer.

Example 49. The device of Example 48, the effective refractive index of the output optical structure being about equal to the effective refractive index of the intermediate spacer.

Example 50. The device of any one of Examples 48 or 49, thickness of the output optical structure being (i) less than about 20. µm thick, less than about 10. µm thick, less than about 5 µm thick, less than about 3.0 µm thick, less than about 2.0 µm thick, or less than about 1.0 µm thick, or (ii) greater than about 1.0 µm thick, greater than about 2.0 µm thick, greater than about 3.0 µm thick, greater than about 5 µm thick, or greater than about 10. µm thick.

Example 51. The device of any one of Examples 48 through 50, the output optical structure including multiple layers of one or more dielectric materials, each of the multiple dielectric layers being transparent at the vacuum wavelength $\lambda_1$ with a corresponding refractive index different from immediately adjacent layers.

Example 52. The device of any one of Examples 48 through 51, the output optical structure including multiple layers of one or more dielectric materials arranged as a multi-layer-reflector (MLR) structure.

Example 53. The device of any one of Examples 48 through 52, the output optical structure including multiple layers of one or more dielectric materials arranged as a dichroic optical filter, a long-pass optical filter, a bandpass optical filter, or a notch optical filter.

Example 54. The device of any one of Examples 48 through 53, the output optical structure including multiple layers of one or more dielectric materials arranged so as to exhibit (i) reflectance at the vacuum wavelength $\lambda_0$ greater than reflectance at the vacuum wavelength $\lambda_1$ or (ii) transmittance at the vacuum wavelength $\lambda_1$ greater than transmittance at the vacuum wavelength $\lambda_0$.

Example 55. The device of any one of Examples 48 through 54, the output optical structure including alternating layers of silicon oxide and titanium oxide, or alternating layers of silicon oxide and niobium oxide.

Example 56. The device of any one of Examples 48 through 50, the output optical structure comprising only a single layer of dielectric material that is transparent at the vacuum wavelength $\lambda_1$ with a refractive index less than that of the wavelength-converting layer.

Example 57. The device of Example 56, the output optical structure comprising only a single layer of silicon dioxide.

Example 58. The device of any one of Examples 48 through 56, the output optical structure including one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 59. The device of any one of Examples 48 through 58, further comprising a metal layer within the output optical structure or on a front surface of the wavelength-converting layer.

Example 60. The device of Example 59, the metal layer being less than about 0.10 µm thick, less than about 0.05 µm thick, less than about 0.020 µm thick, or less than about 0.010 µm thick.

Example 61. The device of any one of Examples 59 or 60, the metal layer including one or more of aluminum, silver, gold, or other suitable metal or metal alloy.

Example 62. The device of any one of Examples 1 through 61, further comprising a back array of micro- or nano-structured scattering elements at the back surface of the wavelength-converting layer, the scattering elements of the back array being arranged collectively so as to optically couple at least a portion of the diode output light propagating in or through the intermediate spacer into one or more of the laterally propagating optical modes.

Example 63. The device of Example 62, the micro- or nano-structured scattering elements of the back array including, formed on or in the wavelength-converting layer, a multitude of suitably sized and shaped projections, holes, depressions, inclusions, or structures.

Example 64. The device of any one of Examples 62 or 63, the micro- or nano-structured scattering elements of the back array including, formed on or in the wavelength-converting layer, an array of nano-antennae, a partial photonic bandgap structure, a photonic crystal, or an array of meta-atoms or meta-molecules.

Example 65. The device of Example 64, the micro- or nano-structured scattering elements of the back array including an array of single nano-antennae, or double nano-antennae (i.e., dimers), that include one or more antenna materials, are shaped, sized, and spaced relative to the vacuum wavelength $\lambda_0$ or $\lambda_1$, and are arranged so as to optically couple at least a portion of the diode output light propagating in or through the intermediate spacer into one or more of the laterally propagating optical modes.

Example 66. The device of any one of Examples 64 or 65, the micro- or nano-structured scattering elements of the back array including a partial photonic bandgap structure arranged with one or more materials, morphology, and spacing relative to the vacuum wavelength $\lambda_0$ or $\lambda_1$, so as to optically couple at least a portion of the diode output light propagating in or through the intermediate spacer into one or more of the laterally propagating optical modes.

Example 67. The device of any one of Examples 64 through 66, the micro- or nano-structured scattering elements of the back array including a photonic crystal arranged with one or more materials, crystal morphology, and crystal-lattice spacing relative to the vacuum wavelength $\lambda_0$ or $\lambda_1$, so as to optically couple at least a portion of the diode output light propagating in or through the intermediate spacer into one or more of the laterally propagating optical modes.

Example 68. The device of any one of Examples 64 through 67, the micro- or nano-structured scattering elements of the back array including an array of meta-atoms or meta-molecules that include one or more meta-materials, are shaped, sized, and spaced relative to the vacuum wavelength $\lambda_0$ or $\lambda_1$, and are arranged so as to optically couple at least a portion of the diode output light propagating in or through the intermediate spacer into one or more of the laterally propagating optical modes.

Example 69. The device of any one of Examples 62 through 68, the micro- or nano-structured scattering elements of the back array being arranged as a surface-lattice-resonance (SLR) structure supporting one or more SLR optical modes at the vacuum wavelength $\lambda_0$ or $\lambda_1$.

Example 70. The device of any one of Examples 62 through 69, size or spacing of the micro- or nano-structured scattering elements of the back array being less than about $\lambda_0/n_S$, less than about $\lambda_0/2n_S$, less than about $\lambda_0/4n_S$, or less than about $\lambda_0/10n_S$.

Example 71. The device of any one of Examples 62 through 70, the micro- or nano-structured scattering elements of the back array including one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 72. The device of any one of Examples 62 through 71, the micro- or nano-structured scattering elements of the back array being arranged as a periodic array.

Example 73. The device of Example 72, the periodic array being a rectangular, hexagonal, or trigonal array.

Example 74. The device of any one of Examples 62 through 71, the micro- or nano-structured scattering elements of the back array being arranged in an irregular or aperiodic arrangement.

Example 75. The device of any one of Examples 1 through 74, the reflector including one or more layers of one or more dielectric materials, each of the dielectric materials being transparent at the vacuum wavelength $\lambda_0$, the one or more dielectric layers having an effective refractive index less than that of the second semiconductor layer.

Example 76. The device of Example 75, the one or more layers of one or more dielectric material including multiple layers arranged as a MLR structure.

Example 77. The device of any one of Examples 1 through 76, the reflector including a transparent electrode layer.

Example 78. The device of Example 77, the transparent electrode layer including one or more of indium tin oxide, indium zinc oxide, or one or more other transparent conductive oxides.

Example 79. The device of any one of Examples 75 through 78, the reflector including one or more electrically conductive vias, each via being arranged as a localized, circumscribed electrical conduction path through the one or more layers of dielectric material.

Example 80. The device of any one of Examples 1 through 79, the reflector including a reflector array of micro- or nano-structured scattering elements arranged as one or more of a MLR structure, a micro- or nano-structured diffractive MLR structure, a distributed Bragg reflector (DBR), a quasi-guided-mode (QGM) structure, or a surface-lattice-resonance surface-lattice-resonance (SLR) structure.

Example 81. The device of any one of Examples 1 through 80, the reflector including a reflector array of micro- or nano-structured scattering elements arranged so that the reflector exhibits non-specular reflective redirection of diode output light incident thereon from within the diode structure.

Example 82. The device of any one of Examples 1 through 81, the reflector being positioned in near-field proximity to the active layer.

Example 83. The device of any one of Examples 75 through 82, one or more dielectric layers of the reflector including one or more materials among: doped or undoped silicon; one or more doped or undoped III-V, II-VI, or Group IV semiconductors; doped or undoped silicon oxide, nitride, or oxynitride; one or more doped or undoped metal oxides, nitrides, or oxynitrides; one or more doped or undoped semiconductor oxides, nitrides, or oxynitrides; one or more optical glasses; or one or more doped or undoped polymers.

Example 84. The device of any one of Examples 75 through 83, the reflector including a metal reflector layer on a back surface thereof.

Example 85. The device of Example 75, the reflector including a metal reflector layer and a single layer of dielectric material.

Example 86. The device of any one of Examples 1 through 74, the reflector including a metal reflector layer directly on a back surface of the second semiconductor layer.

Example 87. The device of any one of Examples 84 through 86, the metal reflector layer including one or more of aluminum, silver, gold, or other suitable metal or metal alloy.

Example 88. The device of any one of Examples 1 through 87, the semiconductor diode structure comprising a semiconductor light-emitting diode.

Example 89. The device of any one of Examples 1 through 88, the diode structure including one or more doped or undoped III-V, II-VI, or Group IV semiconductor materials or alloys or mixtures thereof.

Example 90. The device of any one of Examples 1 through 89, the active layer including one or more doped or undoped III-V, II-VI, or Group IV semiconductor materials or alloys or mixtures thereof.

Example 91. The device of any one of Examples 1 through 90, the active layer including one or more p-n junctions, one or more quantum wells, one or more multi-quantum wells, or one or more quantum dots.

Example 92. An array of multiple light-emitting devices of any one of Examples 1 through 91.

Example 93. The array of Example 92, each light-emitting device of the array being operable independently of at least one other light-emitting device of the array.

Example 94. The array of Example 93, the light-emitting devices of the array exhibiting a contrast ratio for down-converted light exiting from adjacent devices that is greater than 5:1, greater than 10:1, greater than 20:1, greater than 50:1, greater than 100:1, or greater than 300:1.

Example 95. The array of any one of Examples 92 through 94, spacing of the light-emitting devices of the array being less than about 1.0 mm, less than about 0.50 mm, less than about 0.33 mm, less than about 0.20 mm, less than about 0.10 mm, less than about 0.08 mm, less than about 0.05 mm, less than about 0.033 mm, or less than about 0.020 mm.

Example 96. A method for making the light-emitting device of any one of Examples 1 through 95, the method comprising: (A) forming the first semiconductor layer, the active layer, and the second semiconductor layer; (B) forming the reflector on the back surface of the second semiconductor layer; (C) forming the intermediate spacer on the front surface of the first semiconductor layer; and (D) forming the wavelength-converting layer on the intermediate spacer.

Example 97. A method for making the light-emitting device of any one of Examples 30 through 95, the method comprising: (A) forming the first semiconductor layer, the active layer, and the second semiconductor layer; (B) forming the reflector on the back surface of the second semiconductor layer; (C) forming the intermediate spacer on the front surface of the first semiconductor layer; (D) forming the wavelength-converting layer on the intermediate spacer; and (E) forming the front array of micro- or nano-structured scattering elements at the front surface of the wavelength-converting layer.

Example 98. A method for making the light-emitting device of any one of Examples 48 through 95, the method comprising: (A) forming the first semiconductor layer, the active layer, and the second semiconductor layer; (B) forming the reflector on the back surface of the second semiconductor layer; (C) forming the intermediate spacer on the front surface of the first semiconductor layer; (D) forming the wavelength-converting layer on the intermediate spacer; and (E) forming the output optical structure on the front surface of the wavelength-converting layer.

Example 99. A method for making the light-emitting device of any one of Examples 62 through 95, the method comprising: (A) forming the first semiconductor layer, the active layer, and the second semiconductor layer; (B) forming the reflector on the back surface of the second semiconductor layer; (C) forming the intermediate spacer on the front surface of the first semiconductor layer; and (D) forming the wavelength-converting layer on the intermediate spacer and the back array of micro- or nano-structured scattering elements at the back surface of the wavelength-converting layer.

Example 100. A method for operating the light-emitting device of any one of Examples 1 through 95, the method comprising supplying to the light-emitting device electrical current so that the light-emitting device emits down-converted light from the front surface of the wavelength-converting layer.

Example 101. A method for operating the array of any one of Examples 92 through 95, the method comprising supplying to one or more of the light-emitting devices of the array corresponding electrical currents so that those light-emitting devices emit down-converted light from the front surfaces of the corresponding wavelength-converting layers.

Example 102. A method for operating the array of any one of Examples 93 through 95, the method comprising supplying to only a first subset of the light-emitting devices of the array corresponding electrical currents so that the light-emitting devices of the only the first subset emit down-converted light from the front surfaces of the corresponding wavelength-converting layers.

Example 103. The method of Example 102, the method further comprising supplying to only a second subset of the light-emitting devices of the array, different from the first subset, corresponding electrical currents so that the light-emitting devices of the only the second subset emit down-converted light from the front surfaces of the corresponding wavelength-converting layers.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset.

Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about equal to," "substantially equal to," "greater than about," "less than about," and so forth), standard conventions pertaining to measurement precision and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A semiconductor light-emitting device comprising:
a semiconductor diode structure including first and second doped semiconductor layers and an active layer between a back surface of the first semiconductor layer and a front surface of the second semiconductor layer, the active layer being arranged for emitting diode output light, resulting from electrical current flow through the diode structure, at a nominal emission vacuum wavelength $\lambda_0$ to propagate within the diode structure;
a reflector positioned against a back surface of the second semiconductor layer that internally reflects diode output light incident thereon from within the diode structure;
a wavelength-converting layer positioned with a back surface thereof facing and spaced-apart from a front surface of the first semiconductor layer, the wavelength-converting layer absorbing diode output light at the vacuum wavelength $\lambda_0$ and in response emitting down-converted light at a vacuum wavelength $\lambda_1$ that is greater than $\lambda_0$, at least a portion of the down-converted light exiting the wavelength-converting layer through a front surface thereof; and
an intermediate spacer positioned between the front surface of the first semiconductor layer and the back surface of the wavelength-converting layer and comprising one or more dielectric layers, each dielectric layer of the intermediate spacer being at least partly transparent at the vacuum wavelength $\lambda_0$, the intermediate spacer having an effective refractive index $n_S$ less than an effective refractive index $n_C$ of the wavelength-converting layer so that the wavelength-converting layer acts as an optical waveguide supporting one or more laterally propagating optical modes at the vacuum wavelengths $\lambda_0$ and $\lambda_1$.

2. The device of claim 1 wherein (i) single-pass absorption exhibited at the vacuum wavelength $\lambda_0$ by the wavelength-converting layer is less than about 50% or (ii) the wavelength-converting layer is less than about 5 µm thick.

3. The device of claim 1, the wavelength-converting layer being arranged so as to support, at each of the vacuum wavelengths $\lambda_0$ and $\lambda_1$, at most ten laterally propagating optical modes.

4. The device of claim 1, the wavelength-converting layer including a multitude of quantum dots arranged in a layer or matrix structure or dispersed in a transparent solid medium, the quantum dots absorbing diode output light at the vacuum wavelength $\lambda_0$ and emitting down-converted light at the vacuum wavelength $\lambda_1$.

5. The device of claim 1, separation between the wavelength-converting layer and the diode structure being sufficiently large so as to prevent substantial spatial overlap of the one or more laterally propagating modes with the diode structure.

6. The device of claim 1, the intermediate spacer including multiple layers of one or more dielectric materials arranged so as to exhibit (i) reflectance at the vacuum wavelength $\lambda_1$ greater than reflectance at the vacuum wavelength $\lambda_0$ or (ii) transmittance at the vacuum wavelength $\lambda_0$ greater than transmittance at the vacuum wavelength $\lambda_1$.

7. The device of claim 1, the intermediate spacer comprising only a single layer of dielectric material that is transparent at the vacuum wavelength $\lambda_0$ with a refractive index less than that of the wavelength-converting layer.

8. The device of claim 1, further comprising a metal layer within the intermediate spacer or between the intermediate spacer and the wavelength-converting layer.

9. The device of claim 1, further comprising a front array of micro- or nano-structured scattering elements at the front surface of the wavelength-converting layer, the scattering elements of the front array being arranged collectively so as to redirect at least a portion of the down-converted light propagating in or through the wavelength-converting layer to exit through the front surface of the wavelength-converting layer.

10. The device of claim 1, further comprising a back array of micro- or nano-structured scattering elements at the back surface of the wavelength-converting layer, the scattering elements of the back array being arranged collectively so as to optically couple at least a portion of the diode output light propagating in or through the intermediate spacer into one or more of the laterally propagating optical modes.

11. The device of claim 1, the reflector including a reflector array of micro- or nano-structured scattering elements arranged (i) as one or more of a MLR structure, a micro- or nano-structured diffractive MLR structure, a distributed Bragg reflector (DBR), a quasi-guided-mode (QGM) structure, or a surface-lattice-resonance (SLR) structure, or (ii) so that the reflector exhibits non-specular reflective redirection of diode output light incident thereon from within the diode structure.

12. A method for making the light-emitting device of claim 1, the method comprising: (A) forming the first semiconductor layer, the active layer, and the second semiconductor layer; (B) forming the reflector on the back surface of the second semiconductor layer; (C) forming the intermediate spacer on the front surface of the first semiconductor layer; and (D) forming the wavelength-converting layer on the intermediate spacer.

13. The device of claim 1, further comprising an output optical structure positioned on a front surface of the wavelength-converting layer, the output optical structure having an effective refractive index less than a refractive index of the wavelength-converting layer.

14. The device of claim 13, the effective refractive index of the output optical structure being about equal to the effective refractive index of the intermediate spacer.

15. The device of claim 13, the output optical structure including multiple layers of one or more dielectric materials arranged so as to exhibit (i) reflectance at the vacuum wavelength 2 greater than reflectance at the vacuum wavelength $\lambda_1$ or (ii) transmittance at the vacuum wavelength $\lambda_1$ greater than transmittance at the vacuum wavelength $\lambda_0$.

16. The device of claim 13, the output optical structure comprising only a single layer of dielectric material that is transparent at the vacuum wavelength $\lambda_1$ with a refractive index less than that of the wavelength-converting layer.

17. The device of claim 13, further comprising a metal layer within the output optical structure or on a front surface of the wavelength-converting layer.

18. An array of multiple light-emitting devices of claim 1.

19. The array of claim 18, spacing of the light-emitting devices of the array being less than about 0.10 mm, the array exhibiting a contrast ratio for down-converted light exiting from adjacent devices that is greater than 5:1.

20. A method for operating the array of claim 18, the method comprising supplying to one or more of the light-emitting devices of the array corresponding electrical currents so that those light-emitting devices emit down-converted light from the front surfaces of the corresponding wavelength-converting layers.

* * * * *